(12) United States Patent
Huang et al.

(10) Patent No.: US 12,389,690 B2
(45) Date of Patent: Aug. 12, 2025

(54) TRANSIENT VOLTAGE SUPPRESSOR WITH ADJUSTABLE TRIGGER AND HOLDING VOLTAGES

(71) Applicant: AMAZING MICROELECTRONIC CORP., New Taipei (TW)

(72) Inventors: Sung-Chih Huang, Jiaoxi Township (TW); Chih-Ting Yeh, Zhudong Township (TW); Che-Hao Chuang, Jhudong Township (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 394 days.

(21) Appl. No.: 18/074,695

(22) Filed: Dec. 5, 2022

(65) Prior Publication Data
US 2024/0186315 A1    Jun. 6, 2024

(51) Int. Cl.
 *H10D 89/60* (2025.01)
(52) U.S. Cl.
 CPC .................. *H10D 89/713* (2025.01)
(58) Field of Classification Search
 CPC ...... H10D 89/713; H10D 89/931; H10D 8/80; H10D 62/126
 See application file for complete search history.

(56) References Cited

U.S. PATENT DOCUMENTS

| | | | |
|---|---|---|---|
| 7,985,983 B2 | 7/2011 | Russ et al. | |
| 8,809,905 B2 | 8/2014 | Lin et al. | |
| 10,825,805 B2 * | 11/2020 | Mallikarjunaswamy | H10D 89/611 |
| 10,930,637 B2 | 2/2021 | Shen et al. | |
| 10,998,451 B2 | 5/2021 | Sai | |
| 2003/0067040 A1 * | 4/2003 | Chen | H10D 89/813 257/365 |
| 2009/0014800 A1 * | 1/2009 | Hwang | H10D 89/713 257/E29.166 |
| 2013/0127007 A1 * | 5/2013 | Chuang | H10D 89/931 257/E29.007 |

FOREIGN PATENT DOCUMENTS

| | | |
|---|---|---|
| CN | 102738144 A | 10/2012 |
| CN | 112271177 A | 1/2021 |
| TW | I236129 B | 7/2005 |
| TW | I741938 B | 10/2021 |

* cited by examiner

*Primary Examiner* — Minsun O Harvey
*Assistant Examiner* — Alexander Ehrlich
(74) *Attorney, Agent, or Firm* — Birch, Stewart, Kolasch & Birch, LLP

(57) ABSTRACT

A transient voltage suppressor with adjustable trigger and holding voltages is provided, including a heavily doped substrate of a first conductivity type connected to a first node, a lightly doped epitaxial layer of a second conductivity type on the substrate, a first and third well region of the first conductivity type, a second well region of the second conductivity type, a first and third heavily doped region of the second conductivity type and a second heavily doped region of the first conductivity type. The heavily doped regions are commonly electrically connected to a second node, and individually disposed in the well regions. Trenches are disposed opposite in the substrate for electrical isolation. A floating base bipolar junction transistor and silicon controlled rectifier can be respectively formed under a positive and negative surged mode. Accordingly, the invention is advantageous of superior electrical performances, high layout flexibility and low area consumption.

14 Claims, 18 Drawing Sheets

TRANSIENT VOLTAGE SUPPRESSOR WITH ADJUSTABLE TRIGGER AND HOLDING VOLTAGES

BACKGROUND OF THE INVENTION

Field of the Invention

The present disclosure is related to a transient voltage suppressor circuit design scheme. And more particularly, it is related to a transient voltage suppressor which is characterized by having both an adjustable trigger voltage as well as an adjustable holding voltage with less circuit complexity and circuit layout area consumption.

Description of the Prior Art

As known, a transient voltage suppressor or known as TVS is a general classification of electronic components that are designed to react to sudden or momentary overvoltage conditions. One such common device used for this purpose is known as the transient voltage suppression diode, a Zener diode designed to protect electronics device against overvoltages. Another design alternative applies a family of products that are known as metal-oxide varistors (MOV).

Generally, the characteristic of a transient voltage suppressor (TVS) requires that it respond to over-voltages faster than other common overvoltage protection components such as varistors or gas discharge tubes. This makes TVS devices or components much more useful for protection against extremely fast and often damaging voltage spikes, since these fast overvoltage spikes are present on all distribution networks and can be caused by either internal or external events, such as lightning or motor arcing. In addition, applications of transient voltage suppression diodes are able to be used for unidirectional or bidirectional electrostatic discharge (ESD) protection of transmission or data lines in electronic circuits. MOV-based TVSs are used to protect home electronics, distribution systems and may accommodate industrial level power distribution disturbances saving downtime and damage to equipment. The level of energy in a transient overvoltage can be equated to energy measured in joules or related to electric current when devices are rated for various applications. These bursts of overvoltage can be measured with specialized electronic meters that can show power disturbances of thousands of volts amplitude that last for a few microseconds or less.

For instance, an U.S. patent number of U.S. Pat. No. 10,998,451 has disclosed an ESD protection diode as shown in FIG. 1, in which the ESD protection diode 700 has a pnpn thyristor structure of the p+ first contact region (P+) 726, the n-type cathode region (N) 724, the p− anode region (P−) 722, and the n+ substrate region (N+) 720. In addition, the ESD protection diode 700 has an npn transistor structure of the n+ substrate region (N+) 720, the p− anode region (P−) 722, and the n-type cathode region (N) 724. However, what draws our attention is that, when applying the ESD protection diode 700 of the U.S. Pat. No. 10,998,451 application and with the scaling-down of the device it is applied to be protected and a reduced clamp voltage of the ESD protection diode 700 to be expected, the thyristor structure or the npn transistor structure having snapback characteristics is used as the ESD protection diode, and a holding voltage is low (and is the lowest voltage) at the time of the snapback operation occurs. Meanwhile, in the ESD protection diode 700 of the U.S. Pat. No. 10,998,451 application, either the n-type or p-type impurity concentration of its semiconductor regions are also very critical, thereby makes its application become very limited and constrained.

On the other hand, another U.S. Pat. No. 10,930,637 has also disclosed a transient voltage suppressor 102, as illustrated in FIG. 2. And, the design concept of the transient voltage suppressor 102 in the U.S. Pat. No. 10,930,637 application is aimed to modify its pn junction locations such that the pn junctions can be controlled to be buried and beneath the device surface such that the junction capacitance thereof can be effectively reduced. However, it is noted that, in such a circuit structure of the transient voltage suppressor 102, at least two epitaxial layers, including the p-type epitaxial layer (P-epi) 200 and the n-type epitaxial layer (N-epi) 220 are necessary and required. According to such design manners, it is believed that device fabrication cost as well as device design area will be significantly increased. Moreover, the breakdown voltages and its device gain of such a transient voltage suppressor structure are mostly dependent on both the resistivity and the thickness of the p-type epitaxial layer (P-epi) 200 and the n-type epitaxial layer (N-epi) 220, thereby also significantly increasing the process complexity of fabricating such a transient voltage suppressor device in U.S. Pat. No. 10,930,637 application. Apart from these, it is also known that in such a transient voltage suppressor 102 structure, internal circuit component designs will often interfere with each other, and yet becoming much more severe and even less tolerable, and very difficult to control accurately.

As a result, based on the foregoing drawbacks and necessary suppression and elimination of the conventional issues are thus to be expected, it, in view of all, should be apparent and obvious that there is indeed an urgent need for the professionals in the field for a novel and inventive transient voltage suppressor structure to be developed, so as to solve the above-mentioned issues occurring in the prior arts. And in particular, the full detailed specific descriptions and implementations will be provided by Applicants of the present invention in the following paragraphs as below for your references.

SUMMARY OF THE INVENTION

In order to overcome the above-mentioned disadvantages, one major objective in accordance with the present invention is provided for a novel and creative circuit scheme for providing a transient voltage suppressor structure. And more particularly, the proposed circuit scheme of the transient voltage suppressor structure is characterized by having both an adjustable trigger voltage and an adjustable holding voltage, under the circumstance of using less circuit complexity and circuit layout area consumption Another objective in accordance with the present invention is to provide a novel transient voltage suppressor structure, in which, when a sweeping voltage is injected from its positive terminal, a bipolar junction transistor (BJT) having a floating base is formed. On the other hand, when a sweeping voltage is injected from its negative terminal, a silicon controlled rectifier (SCR) having a floating base is correspondingly formed. Therefore, it can be verified that by employing the present invention, due to the floating-base silicon controlled rectifier to be provided at the time a negative-surged mode (the sweeping voltage is injected from its negative terminal) is made, a much more reduced trigger voltage can be achieved. Even more, the silicon controlled rectifier having the floating base is able to perform and act capable of as being a forward biased diode which shows no snapback effect.

And yet, one more another objective in accordance with the present invention is to provide an inventive transient voltage suppressor structure, in which its device breakdown voltages and gain performance of such a transient voltage suppressor structure can be simply adjusted by adopting ion implantation, instead of conventional practical physical device process modification, for example, changing the dopants resistivity and the structural thickness thereof. As a result, it is apparent that the process complexity of the present invention is able to be made lowered and easy to be in control.

Therefore, in the following descriptions, the Applicants will proceed to provide a plurality of embodiments and variations that will be discussed later in the following paragraphs in order to verify the proposed transient voltage suppressor structure is effective. Thereby, it is worthy of full attentions that the present invention achieves to successfully solves the problems of prior arts and meanwhile maintain superior electrical properties. As a result, it is believed that the proposed technical contents of the present invention are extremely advantageous of as being highly competitive and able to be widely utilized in related IC and semiconductor industries.

Therefore, in order to achieve the above-mentioned objectives, the present invention is aimed to provide a modified transient voltage suppressor for having adjustable trigger and holding voltages introduced as follows.

According to the present invention, the transient voltage suppressor with adjustable trigger and holding voltages includes a heavily doped substrate, a lightly doped epitaxial layer, a first well region, a second well region, a third well region and two trenches. According to the embodiment of the present invention, the heavily doped substrate has a first conductivity type, and the heavily doped substrate is electrically connected to a first node. The lightly doped epitaxial layer has a second conductivity type, which is opposite to the foregoing first conductivity type, and the lightly doped epitaxial layer is formed on the heavily doped substrate.

The first well region has the first conductivity type, the second well region has the second conductivity type, the third well region has the first conductivity type, and the first well region, the second well region and the third well region are configured and formed in the lightly doped epitaxial layer. In addition, a first heavily doped region of the second conductivity type is further disposed in the first well region. A second heavily doped region of the first conductivity type is further disposed in the second well region, and a third heavily doped region of the second conductivity type is further disposed in the third well region. The first heavily doped region, the second heavily doped region and the third heavily doped region are commonly electrically connected to a second node.

According to the present invention, the two trenches are disposed opposite in the heavily doped substrate and having a depth not less than that of the lightly doped epitaxial layer, wherein each of the two trenches is respectively configured at an outer side of the first well region and the third well region for electrical isolation.

According to one preferred embodiment of the present invention, when the first conductivity type is N type and the second conductivity type is P type, the above-mentioned first node and the second node are electrically coupled to an I/O pin and a ground terminal, respectively.

In such an embodiment of the present invention, when a sweeping voltage is injected into the I/O pin, it is believed that a bipolar junction transistor having a floating base is formed. And, the bipolar junction transistor having a floating base is composed of the heavily doped substrate, the lightly doped epitaxial layer, the second well region and the second heavily doped region, wherein the floating base of the bipolar junction transistor is formed by the lightly doped epitaxial layer (a P− epi layer) and the second well region (a P-type well region).

On the other hand, when the sweeping voltage is injected into the ground terminal, then a silicon controlled rectifier having a floating base is formed and the silicon controlled rectifier having a floating base is composed of the first heavily doped region, the third heavily doped region, the first well region, the third well region, the lightly doped epitaxial layer and the heavily doped substrate. In such an embodiment, the floating base of the silicon controlled rectifier is formed by the first well region (an N-type well region), the third well region (an N-type well region) and the lightly doped epitaxial layer (a P− epi layer).

Moreover, according to one variant embodiment of the present invention, the transient voltage suppressor with adjustable trigger and holding voltages may further include a blanket implant layer, which is disposed between the lightly doped epitaxial layer and the heavily doped substrate. And, the blanket implant layer can be either having the first conductivity type or having the second conductivity type. According to such a variant embodiment, the depth of each of the two trenches is further not less than that of the blanket implant layer. By controlling the resistivity of the lightly doped epitaxial layer and the blanket implant layer (either P-type or N-type), the present invention is made to be able to achieve the design of large range of breakdown voltages of the bipolar junction transistor having a floating base.

And furthermore, according to one another variant embodiment of the present invention, the transient voltage suppressor with adjustable trigger and holding voltages may further include a first lightly doped implant layer of the first conductivity type, wherein the first lightly doped implant layer of the first conductivity type may be further disposed in the second well region of the second conductivity type and surrounding the second heavily doped region of the first conductivity type.

And yet, according to one further variant embodiment of the present invention, when the transient voltage suppressor with adjustable trigger and holding voltages further includes the first lightly doped implant layer of the first conductivity type, a second lightly doped implant layer of the second conductivity type may be further buried in the second well region of the second conductivity type and the second lightly doped implant layer of the second conductivity type is underneath the foregoing first lightly doped implant layer of the first conductivity type.

And in another aspect, according to another variant embodiment of the present invention, then the transient voltage suppressor with adjustable trigger and holding voltages may alternatively include two first lightly doped implant layers of the first conductivity type. And, the two first lightly doped implant layers of the first conductivity type are disposed in the second well region of the second conductivity type and each of the two first lightly doped implant layers is disposed at a corner of the second heavily doped region of the first conductivity type.

And in such an embodiment when the transient voltage suppressor with adjustable trigger and holding voltages further includes the two first lightly doped implant layer of the first conductivity type at the corners of the second heavily doped region of the first conductivity type, a second lightly doped implant layer of the second conductivity type can be further disposed, and the second lightly doped implant layer of the second conductivity type is buried in the second well region and between the two first lightly doped implant layers.

According to such variant embodiments of the present invention, the thickness and resistivity of the lightly doped epitaxial layer of the second conductivity type (for instance, a lightly doped P-type epitaxial layer), the second well region of the second conductivity type (for instance, a P-type well region), the first lightly doped implant layer of the first conductivity type (for instance, an N-type lightly doped implant layer, for example also known as an NESD layer) and the second lightly doped implant layer of the second conductivity type (a P-type lightly doped implant layer, for example, also known as a PESD layer) can be adopted as variables in order to adjust the gain of the bipolar junction transistor having a floating base of the present invention.

And yet even furthermore regarding a plurality of variant embodiments of the present invention, the transient voltage suppressor with adjustable trigger and holding voltages disclosed in the present invention may further include a fourth heavily doped region of the first conductivity type, a fifth heavily doped region of the first conductivity type, a sixth heavily doped region of the second conductivity type and a seventh heavily doped region of the second conductivity type. The fourth heavily doped region of the first conductivity type is disposed in the first well region. The fifth heavily doped region of the first conductivity type is disposed in the third well region. In addition, the fourth heavily doped region of the first conductivity type and the sixth heavily doped region of the second conductivity type are electrically connected in common, and the fifth heavily doped region of the first conductivity type and the seventh heavily doped region of the second conductivity type are electrically connected in common. In one embodiment of the present invention, the sixth heavily doped region of the second conductivity type can be disposed in the second well region of the second conductivity type, and the seventh heavily doped region of the second conductivity type can be disposed in the second well region of the second conductivity type.

However, the present invention is certainly not limited thereto by the above-mentioned embodiment. On the other hand, in an alternative embodiment, when the transient voltage suppressor with adjustable trigger and holding voltages disclosed in the present invention further includes the fourth heavily doped region of the first conductivity type, the fifth heavily doped region of the first conductivity type, the sixth heavily doped region of the second conductivity type and the seventh heavily doped region of the second conductivity type, and the fourth heavily doped region of the first conductivity type is disposed in the first well region, the fifth heavily doped region of the first conductivity type is disposed in the third well region, the fourth heavily doped region of the first conductivity type and the sixth heavily doped region of the second conductivity type are electrically connected in common, and the fifth heavily doped region of the first conductivity type and the seventh heavily doped region of the second conductivity type are electrically connected in common, at this time, the sixth heavily doped region of the second conductivity type can be alternatively disposed in the lightly doped epitaxial layer, and the seventh heavily doped region of the second conductivity type can be alternatively disposed in the lightly doped epitaxial layer, instead of being configured in the second well region of the second conductivity type as recited in the previous embodiment.

And yet, still in one another alternative embodiment of the present invention, the transient voltage suppressor with adjustable trigger and holding voltages disclosed in the present invention may further include a fourth heavily doped region of the first conductivity type, a fifth heavily doped region of the first conductivity type, a sixth lightly doped implant layer of the second conductivity type, and a seventh lightly doped implant layer of the second conductivity type, wherein the fourth heavily doped region is disposed between the first heavily doped region and the second heavily doped region, and the fifth heavily doped region is disposed between the third heavily doped region and the second heavily doped region. In such a variant embodiment of the present invention, the sixth lightly doped implant layer of the second conductivity type is disposed in the lightly doped epitaxial layer, and the fourth heavily doped region of the first conductivity type is surrounded by the sixth lightly doped implant layer of the second conductivity type and the first well region of the first conductivity type. Meanwhile, the seventh lightly doped implant layer of the second conductivity type is also disposed in the lightly doped epitaxial layer, and the fifth heavily doped region of the first conductivity type is surrounded by the seventh lightly doped implant layer of the second conductivity type and the third well region of the first conductivity type.

By employing the fourth heavily doped region, the fifth heavily doped region, the sixth heavily doped region, the seventh heavily doped region, as well as the sixth lightly doped implant layer and the seventh lightly doped implant layer as disclosed in the above-mentioned embodiments, a plurality of trigger nodes of the proposed transient voltage suppressor by the present invention are provided. As a result, trigger voltages ($V_T$) of the proposed transient voltage suppressor is made to be adjustable and controllable, and not affected and determined by the dopant concentration of the first well region of the first conductivity type and the third well region of the first conductivity type (for instance, an N-type well region).

It is noted that, according to the foregoing disclosed technical contents provided by the Applicant, the present invention is definitely not limited thereto such embodiments. In other words, for people who are skilled in the art and having ordinary understandings and technical backgrounds to the present invention, it would be allowed for them to make various modifications or changes depending on different circuit regulations and/or specifications without departing from the scope of the invention. That is to say, the present invention is certainly not limited thereto. And the variant embodiments and/or circuit implementations should still fall into the claim scope of the present invention.

In general, those skilled in the art and having general knowledge are able to make appropriate modifications or variations with respective to the technical contents disclosed in the present invention without departing from the spirits of the present invention. The present invention is not restricted by the certain limited configurations and/or circuit diagrams disclosed in the embodiments of the present invention. As such, it is believed that the modifications or variations should still fall into the scope of the present invention, and the present invention covers the modifications and its equality.

As a result, based on the disclosed technical features illustrated as above, it is evident that the present invention is sophisticatedly designed and indeed discloses a novel modified scheme for a new transient voltage suppressor circuit structure with adjustable trigger and holding voltages. By employing the present invention, it is believed that the present invention achieves in effectively both eliminating the conventional drawback issues and obtaining a large range of breakdown voltages when forming a bipolar junction transistor having a floating base under a positive-surged mode (the sweeping voltage is injected into the I/O pin from the N-type heavily doped substrate).

On the contrary, when the sweeping voltage is injected into the ground terminal from the first heavily doped region, the second heavily doped region and the third heavily doped region (for example, a P+ doped region, an N+ doped region and a P+ doped region) and thus a silicon controlled rectifier having a floating base is formed under such a negative-surged mode (the sweeping voltage is injected into the ground terminal from the P+ doped region, the N+ doped region and the P+ doped region oppositely), it is believed that the floating base silicon controlled rectifier of the present invention is able to act as a forward biased diode and thereby shows no snapback effect.

The proposed transient voltage suppressor circuit scheme is thus inventive and is highly efficient since circuit complexity for implementing such the disclosed transient voltage suppressor with adjustable trigger and holding voltages is also made to be relatively low.

As a result, it is believed that the proposed transient voltage suppressor with adjustable trigger and holding voltages disclosed by the present invention, is beneficial in view of a great number of merits. Thus, it is believed that the present invention is extremely advantageous while compared to the prior arts.

These and other objectives of the present invention will become obvious to those of ordinary skill in the art after reading the following detailed description of preferred embodiments. And it is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
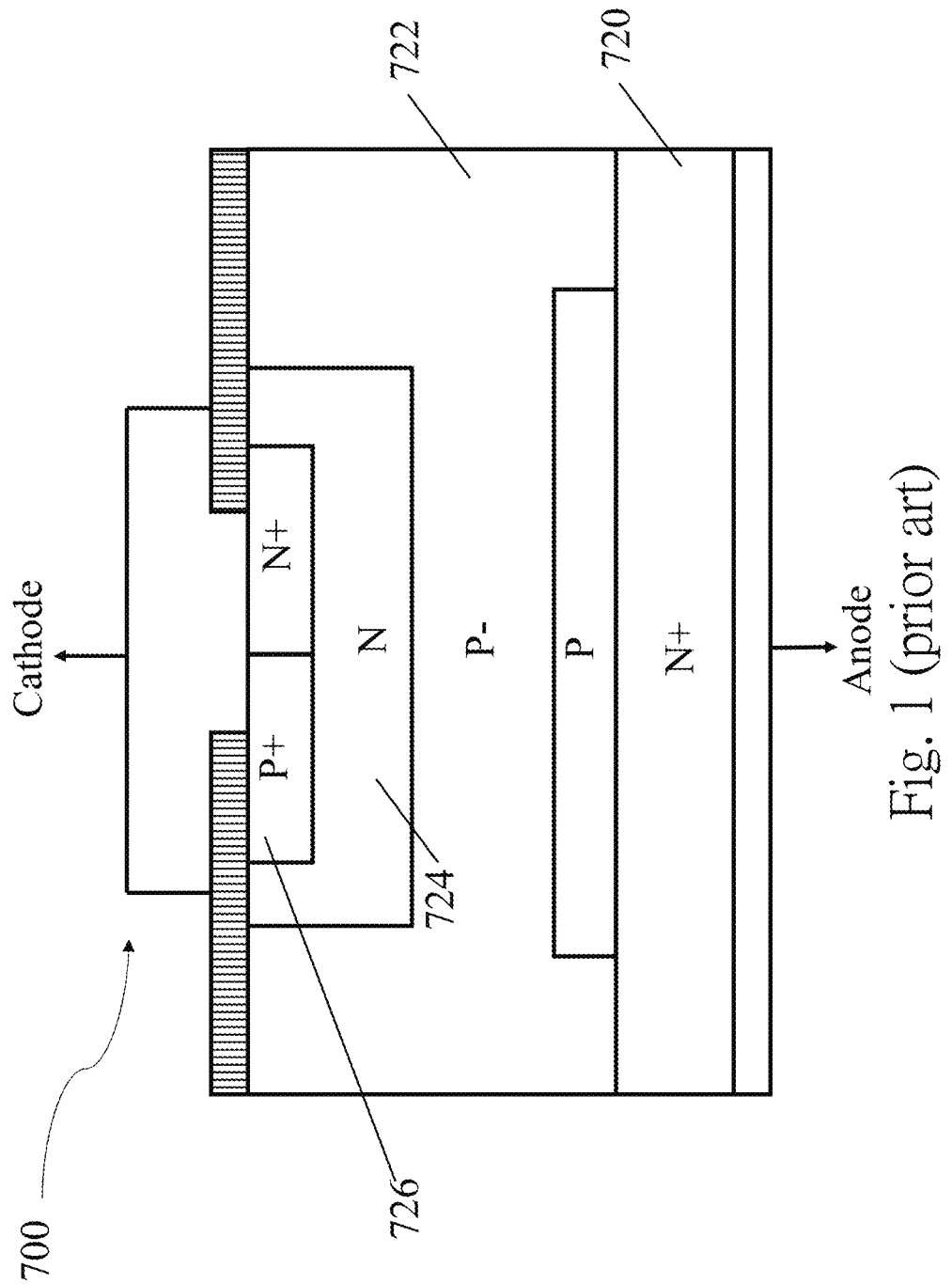
FIG. 1 shows a schematical diagram illustrating a conventional ESD protection device in the prior art.
Figure 2:
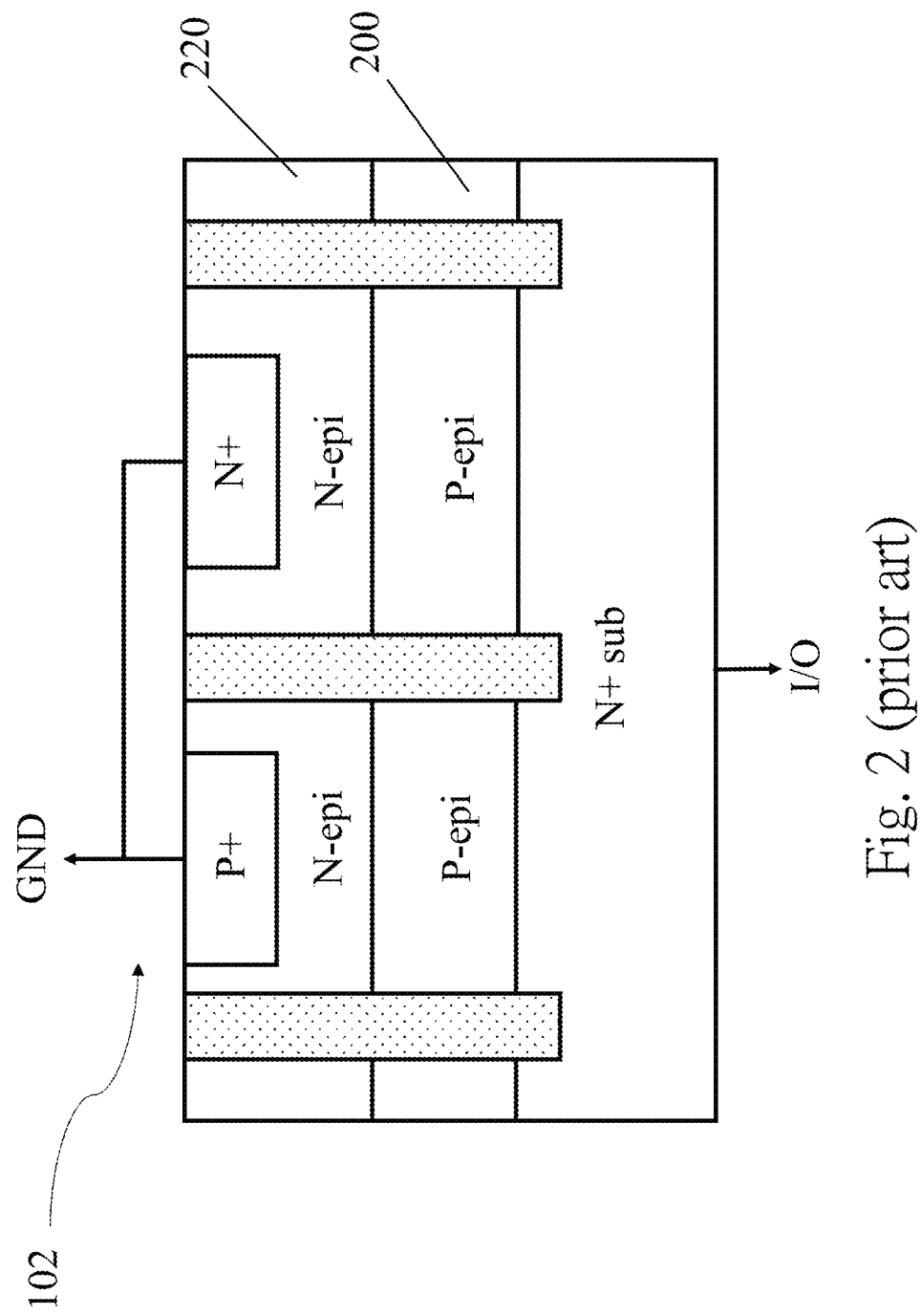
FIG. 2 shows a schematical diagram illustrating a conventional transient voltage suppressor using double epitaxial layers in the prior art.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that it is not intended to limit the scope of the present invention. Therefore, any equivalent modification or variation according to the spirit of the present invention is to be also included within the scope of the present invention.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

As the Applicants have described earlier in the Description of the Prior Art, since the conventional arts are mostly in lack of circuit design flexibility and consuming a great amount of circuit layout area as well as production cost, the present invention is thus provided and aimed to solve such drawbacks by proposing a novel and inventive transient voltage suppressor with adjustable trigger and holding voltages. The disclosed transient voltage suppressor circuit design will be provided and illustrated by a plurality of variant embodiments as described in the following sections for references.

Figure 3:
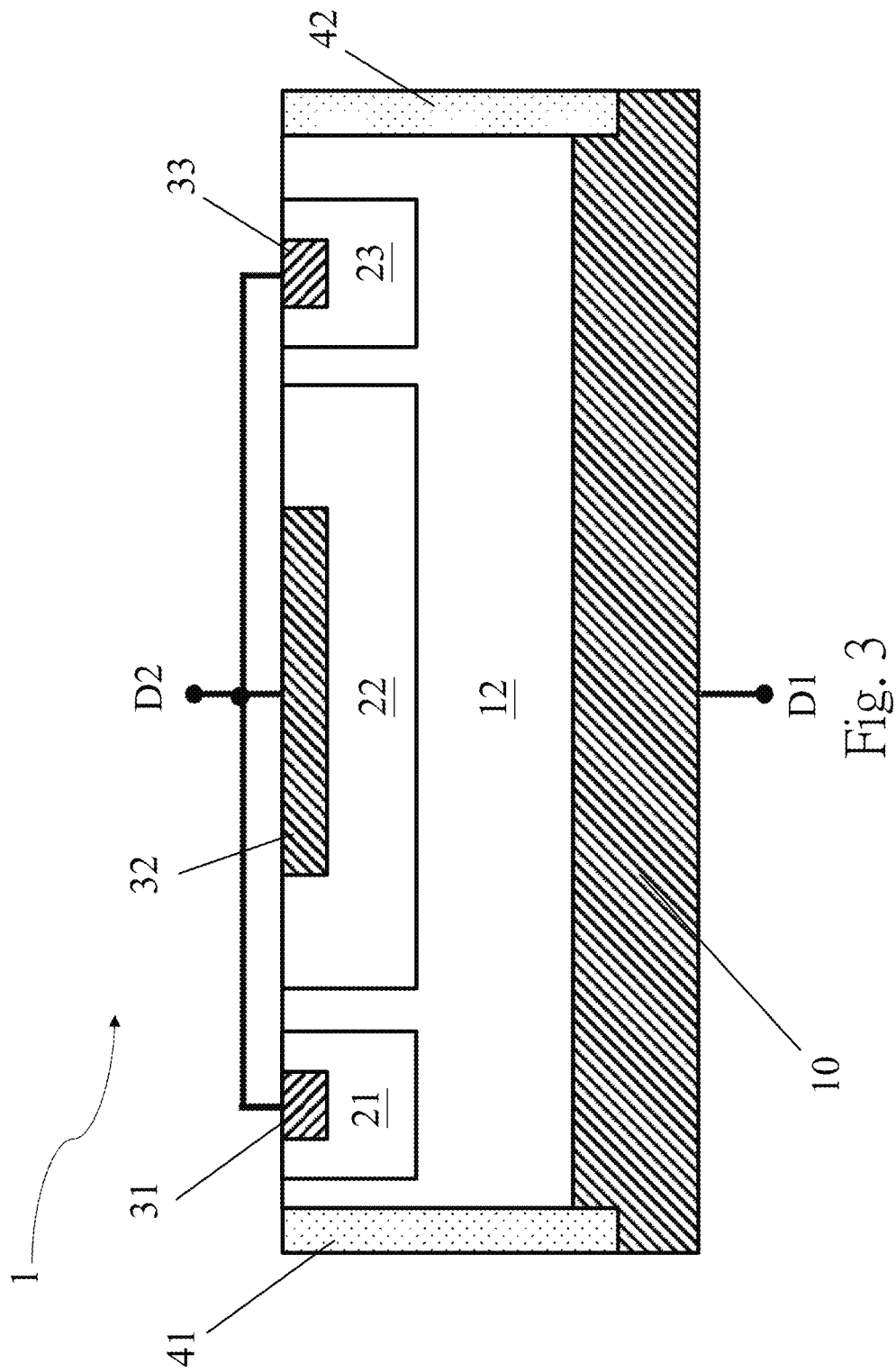
FIG. 3 schematically shows a structural diagram of a proposed transient voltage suppressor with adjustable trigger and holding voltages in accordance with one embodiment of the present invention.

Please refer to FIG. 3 first, which schematically shows a structural diagram of a proposed transient voltage suppressor with adjustable trigger and holding voltages in accordance with one embodiment of the present invention. According to the present invention, the proposed transient voltage suppressor with adjustable trigger and holding voltages 1 includes a heavily doped substrate 10, a lightly doped epitaxial layer 12, a first well region 21, a second well region 22, a third well region 23, a first heavily doped region 31, a second heavily doped region 32 and a third heavily doped region 33. According to FIG. 3, the heavily doped substrate 10 has a first conductivity type and the heavily doped substrate 10 is electrically connected to a first node D1.

The lightly doped epitaxial layer 12 has a second conductivity type, which is opposite the first conductivity type of the heavily doped substrate 10, and the lightly doped epitaxial layer 12 is formed on the heavily doped substrate 10.

The first well region 21 has the first conductivity type, the second well region 22 has the second conductivity type and the third well region 23 has the first conductivity type, and the first well region 21, the second well region 22, and the third well region 23 are commonly configured and formed in the foregoing lightly doped epitaxial layer 12.

According to FIG. 3, the first heavily doped region 31 has the second conductivity type and the first heavily doped region 31 of the second conductivity type is further disposed in the first well region 21 of the first conductivity type.

The second heavily doped region 32 has the first conductivity type and the second heavily doped region 32 of the first conductivity type is further disposed in the second well region 22 of the second conductivity type.

The third heavily doped region 33 has the second conductivity type and the third heavily doped region 33 of the second conductivity type is further disposed in the third well region 23 of the first conductivity type.

As can be seen, the first heavily doped region 31 of the second conductivity type, the second heavily doped region 32 of the first conductivity type and the third heavily doped region 33 of the second conductivity type are commonly electrically connected to a second node D2.

Two trenches 41, 42, are being disposed opposite in the heavily doped substrate 10, and each of the trenches 41, 42 has a depth not less than that of the lightly doped epitaxial layer 12. As noted, each of the two trenches 41, 42 is respectively configured at an outer side of the first well region 21 and the third well region 23 for electrical isolation.

Figure 4:
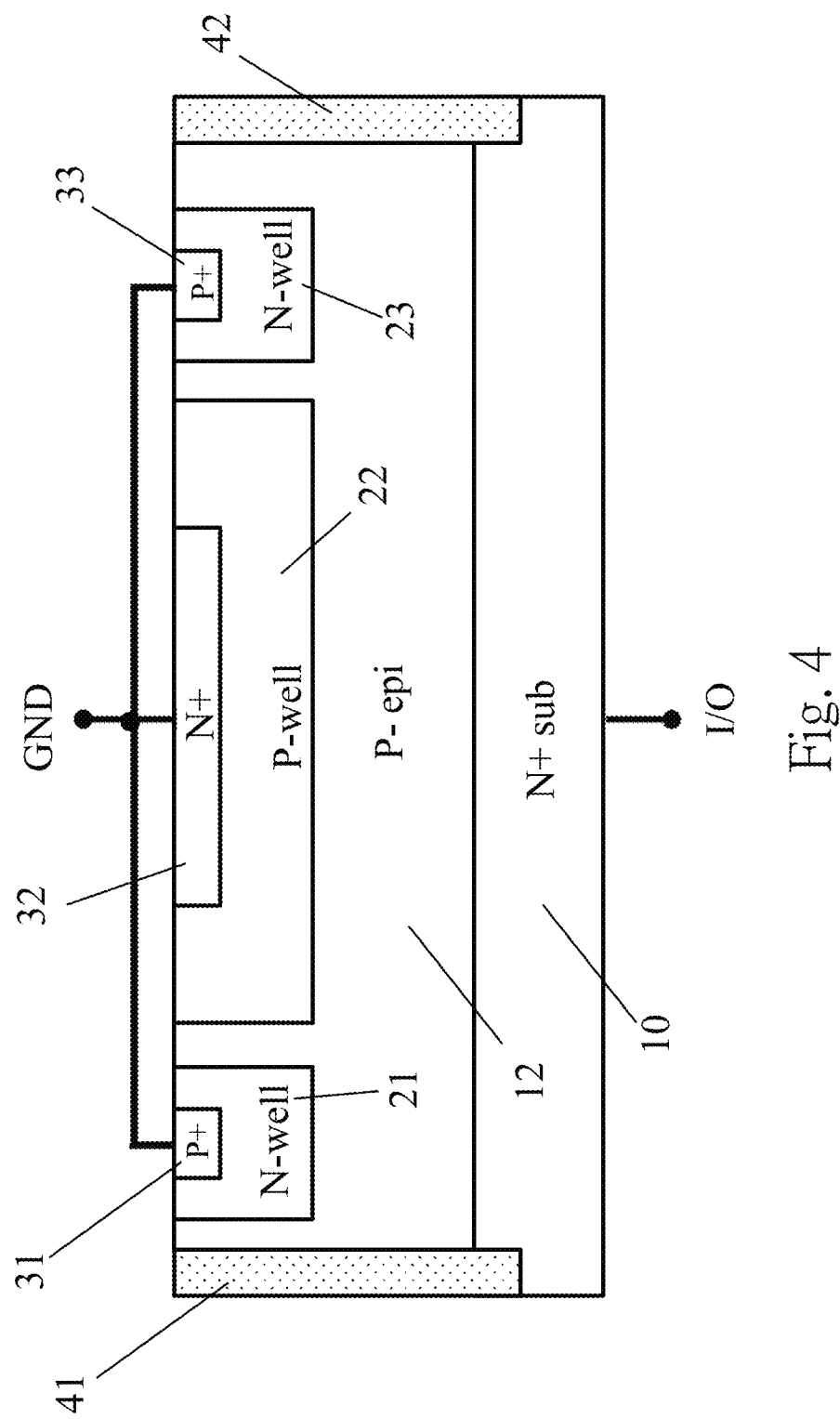
FIG. 4 shows an illustrative embodiment according to FIG. 3 when the first conductivity type is N type and the second conductivity type is P type in accordance with the embodiment of the present invention.

According to the FIG. 3 embodiment, when the first conductivity type is N type, the second conductivity type is P type. And, FIG. 4 shows an illustrative embodiment according to FIG. 3 when the first conductivity type and the second conductivity type is N type and P type, respectively. Under such a circumstance, as can be seen in FIG. 4, the heavily doped substrate 10 of the first conductivity type is an N-type heavily doped substrate and is illustrated as a "N+ sub", and the first node D1 the "N+ sub" is connected thereto, is electrically coupled to an I/O pin "I/O".

The lightly doped epitaxial layer 12 of the second conductivity type is a P-type lightly doped epitaxial layer and is illustrated as a "P– epi".

The first well region 21 of the first conductivity type is an N-type well region and is illustrated as an "N-well" in FIG. 4. Similarly, the second well region 22 of the second conductivity type is a P-type well region and is illustrated as a "P-well" in FIG. 4, and the third well region 23 of the first conductivity type is an N-type well region and is illustrated as an "N-well" in FIG. 4.

In addition, the first heavily doped region 31 of the second conductivity type is a P-type heavily doped region and is illustrated as a "P+" in FIG. 4. Similarly, the second heavily doped region 32 of the first conductivity type is an N-type heavily doped region and is illustrated as a "N+" in FIG. 4. And the third heavily doped region 33 of the second conductivity type is a P-type heavily doped region and is illustrated as a "P+" in FIG. 4. As can be seen, the second node D2, where the first heavily doped region 31 (P+), the second heavily doped region 32 (N+) and the third heavily doped region 33 (P+) are commonly connected thereto, will be electrically coupled to a ground terminal "GND".

Nevertheless, according to the present invention, the present invention is certainly not limited thereto such embodiment. According to alternative embodiments of the present invention, the first conductivity type may also be illustrative as a P type, and the second conductivity type may be illustrative as an N type as well, and the alternative variations and embodiments may also be made by people who are skilled in the art and having ordinary skills of the art. And yet, the present invention still covers the modifications and its equality based on the disclosed technical contents of the present invention.

Figure 5:
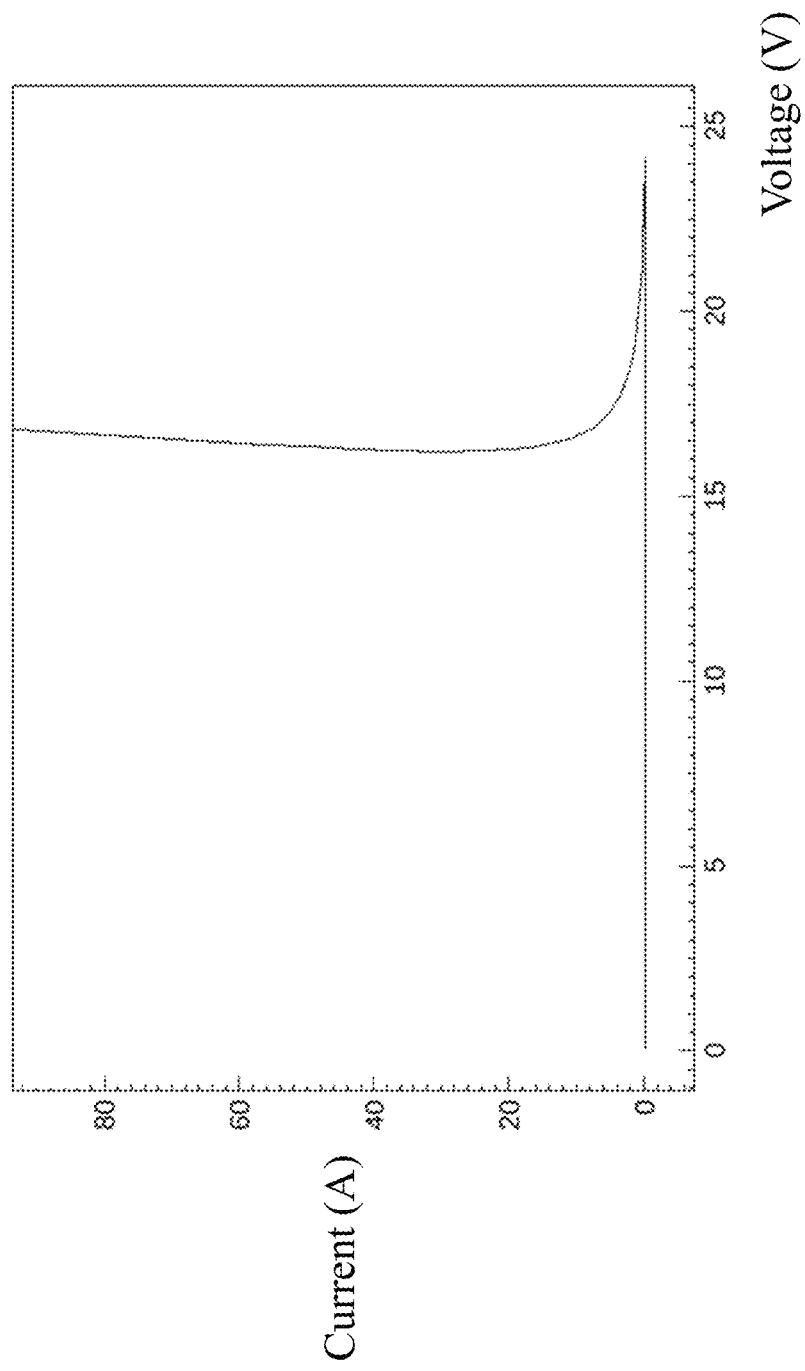
FIG. 5 schematically shows a current-voltage (I-V) curve diagram of the n-p-n bipolar junction transistor (BJT) having a floating base in accordance with the embodiment of the present invention, in which the voltage is applied to I/O with grounded GND of FIG. 4.

Therefore, according to the present invention as shown in FIG. 4, when a sweeping voltage is provided and injected into the I/O pin "I/O", a bipolar junction transistor (BJT) having a floating base is thus formed and the floating base bipolar junction transistor (BJT) is composed of the heavily doped substrate "N+ sub", the lightly doped epitaxial layer "P– epi", the second well region "P-well" and the second heavily doped region "N+". As a result, an n-p-n bipolar junction transistor (BJT) having a floating base is formed, and the floating base of the n-p-n bipolar junction transistor is formed due to the lightly doped epitaxial layer "P– epi" and the second well region "P-well". Please refer to FIG. 5 for a current-voltage (I-V) curve diagram of the n-p-n bipolar junction transistor (BJT) having a floating base in accordance with the embodiment of the present invention. In FIG. 5, the voltage is applied to the I/O pin in relative with the grounded ground terminal GND in FIG. 4. As we can see, under the positive-surged mode (the sweeping voltage is injected into the I/O pin from the N-type heavily doped substrate), the gain of the formed n-p-n bipolar junction transistor (BJT) having a floating base can be adjusted by the second well region "P-well" and the present invention is able to achieve in discharging the surged current much more efficiently than the conventional arts, and the transient voltage suppressor is therefore accordingly characterized by having an adjustable trigger voltage and a holding voltage.

Figure 6:
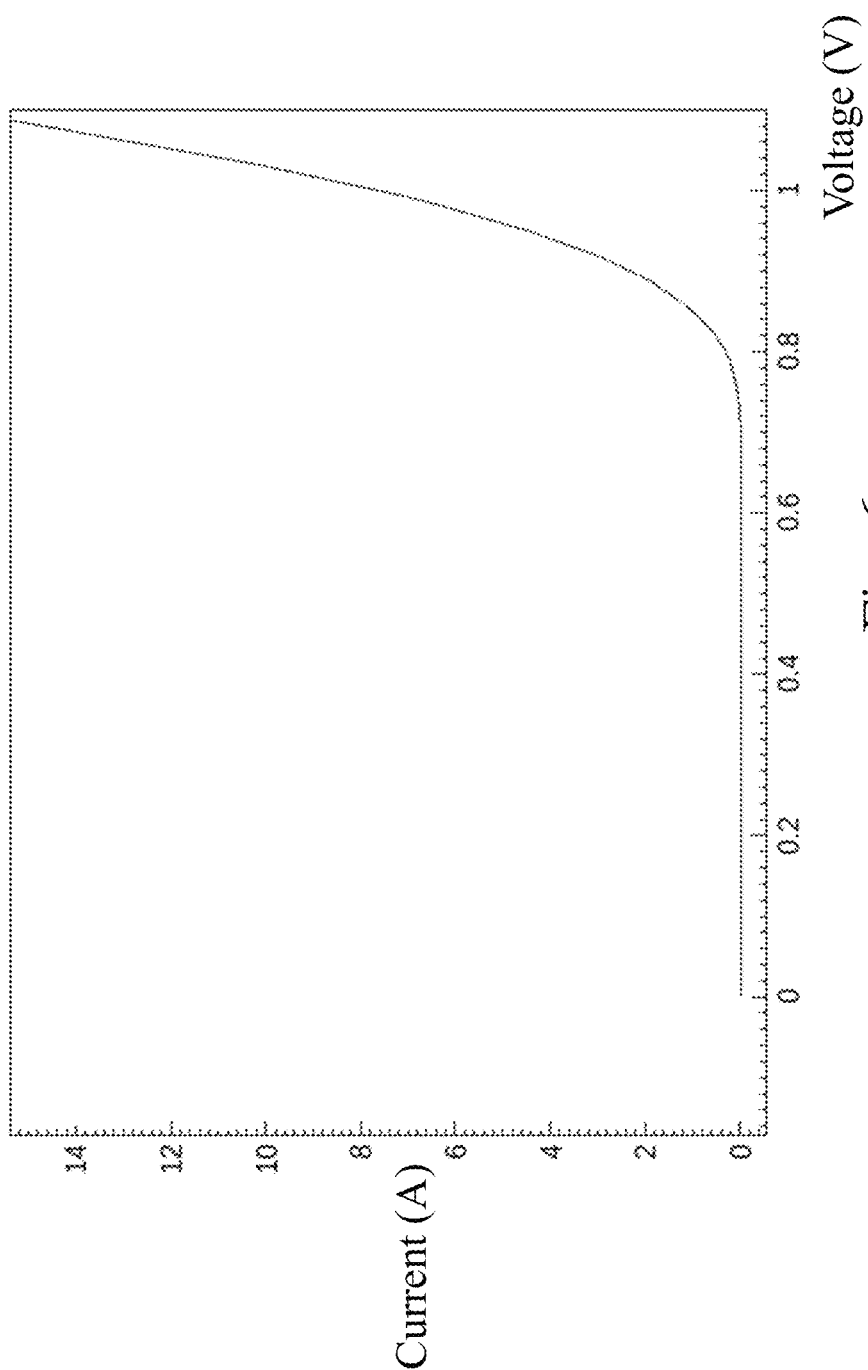
FIG. 6 schematically shows a current-voltage (I-V) curve diagram of the p-n-p-n silicon controlled rectifier (SCR) having the floating base in accordance with the embodiment of the present invention, in which the voltage is applied to GND with grounded I/O of FIG. 4.

In another aspect, when the sweeping voltage, on the contrary, is injected into the ground terminal "GND", then a silicon controlled rectifier (SCR) having a floating base will be formed and the floating base silicon controlled rectifier is composed of the first and the third heavily doped regions "P+", the first and the third well regions "N-well", the lightly doped epitaxial layer "P– epi" and the heavily doped substrate "N+ sub". As a result, it is believed that a p-n-p-n silicon controlled rectifier (SCR) having a floating base is formed, and the floating base of the p-n-p-n silicon controlled rectifier is formed due to the first and the third well regions "N-well" and the lightly doped epitaxial layer "P– epi". Subsequently, please refer to FIG. 6 for a current-voltage (I-V) curve diagram of the p-n-p-n silicon controlled rectifier (SCR) having the floating base in accordance with the embodiment of the present invention. In FIG. 6, the voltage is applied to the ground terminal GND in relative with the grounded I/O pin in FIG. 4. As we can see, under the negative-surged mode (the sweeping voltage is injected into the ground terminal "GND" from the P+ doped region, the N+ doped region and the P+ doped region), the p-n-p-n floating base silicon controlled rectifier of the present invention is able to have a diode-like I-V curve, and the p-n-p-n floating base silicon controlled rectifier is able to act as a forward biased diode and thereby shows no snapback effect. Due to the diode-like I-V characteristic of the floating base silicon controlled rectifier formed by the present invention, the present invention is able to achieve in discharging the surged current much more efficiently than the conventional arts. In addition, by adjusting and varying the dopants concentration of the first and the third well regions "N-well", the trigger voltage of the transient voltage suppressor can also be modified. And therefore, it is believed that the disclosed transient voltage suppressor is accordingly characterized by having an adjustable trigger voltage ($V_T$).

Hereinafter, according to the technical contents of the present invention, the Applicant of the present invention further provides a plurality of feasible embodiments in the following paragraphs for implementing the inventive effect of the invention for your references. Please proceed to FIG. 7 for another structural diagram of a proposed transient voltage suppressor with adjustable trigger and holding voltages in accordance with one embodiment of the present invention, in which a blanket implant layer 171 is further disposed.

Figure 7:
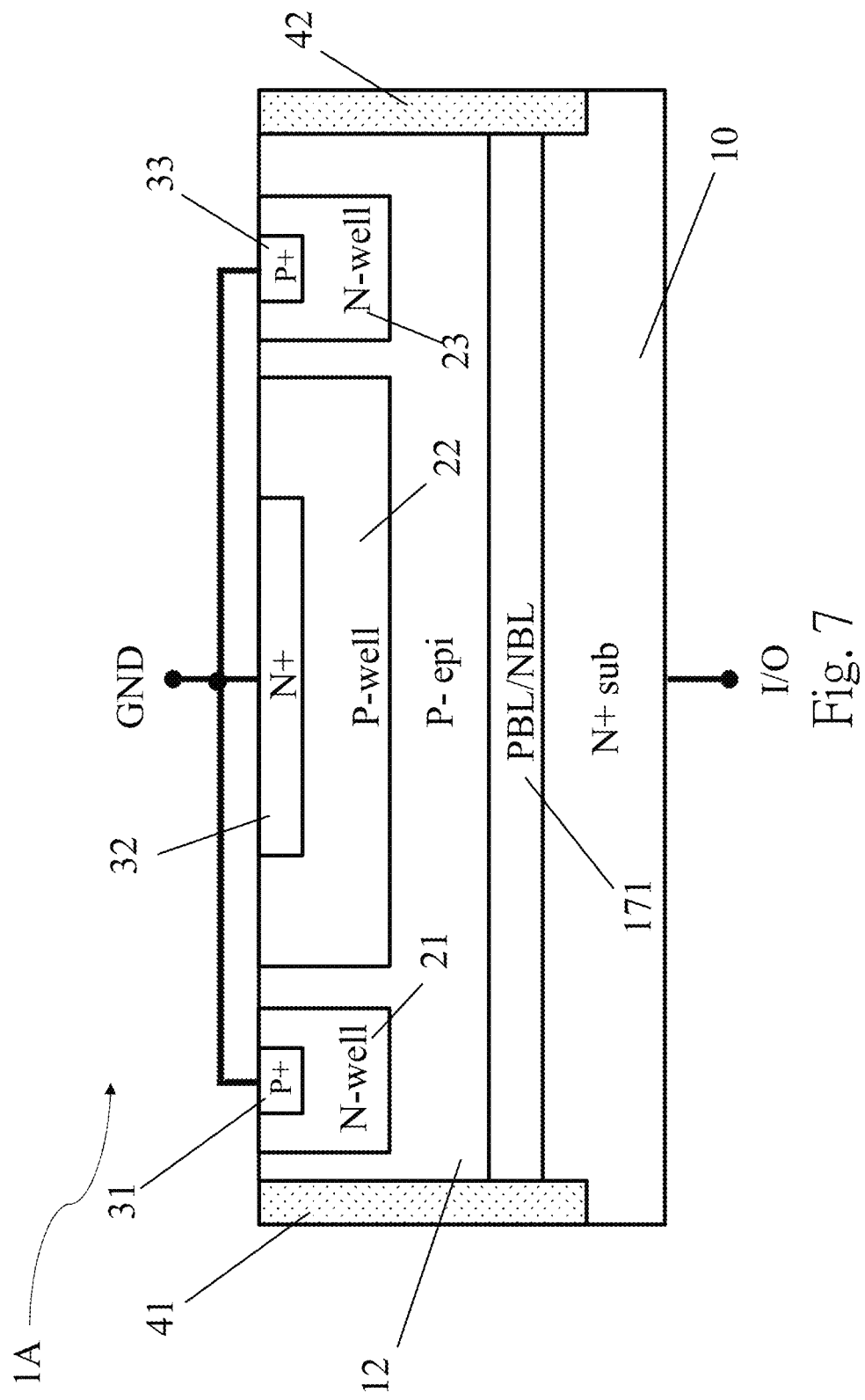
FIG. 7 schematically shows a structural diagram of a proposed transient voltage suppressor with adjustable trigger and holding voltages in accordance with one embodiment of the present invention, in which a blanket implant layer is further disposed.

As we can see from FIG. 7, the transient voltage suppressor with adjustable trigger and holding voltages 1A may further include the blanket implant layer 171, which is disposed between the lightly doped epitaxial layer ("P– epi") 12 and the heavily doped substrate ("N+ sub") 10. And the depth of each of the two trenches 41, 42 is further not less than that of the blanket implant layer 171. According to such embodiment, the blanket implant layer 171 can be either of the first conductivity type or of the second conductivity type. In other words, the blanket implant layer 171 can alternatively be an N-type blanket implant layer (NBL) or a P-type blanket implant layer (PBL). In view of such an embodiment, it is applicable to design and achieve in a large range of breakdown voltages of the bipolar junction transistor having a floating base by controlling the resistivity of the lightly doped epitaxial layer ("P– epi") 12 and the blanket implant layer (NBL or PBL) 171. In addition, the resistivity of the lightly doped epitaxial layer ("P– epi") 12 is also a variable to adjust the breakdown voltage of the floating base bipolar junction transistor disclosed in the present invention.

Figure 8:
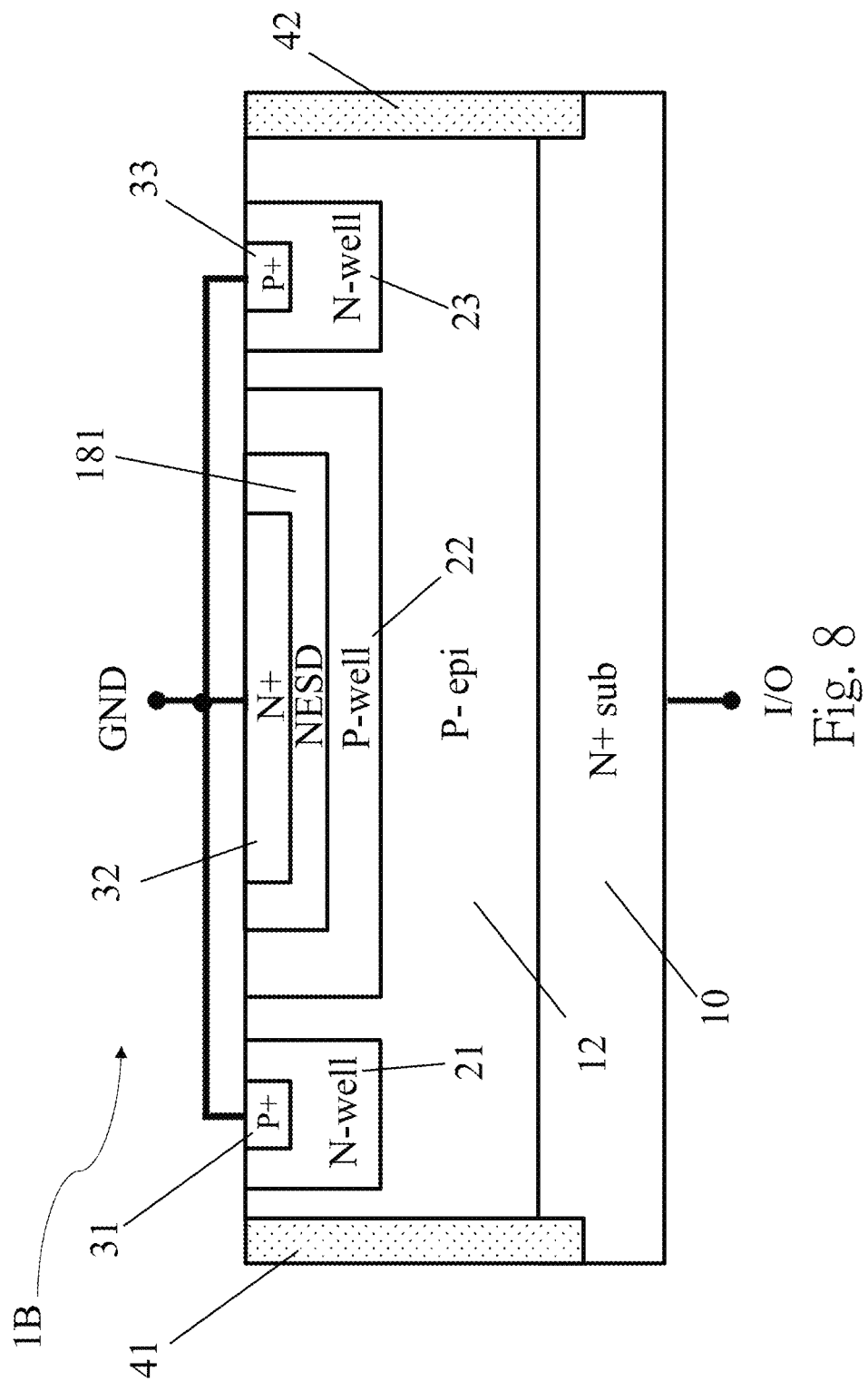
FIG. 8 schematically shows another structural diagram of a proposed transient voltage suppressor with adjustable trigger and holding voltages in accordance with one embodiment of the present invention, in which a first lightly doped implant layer is further disposed.

FIG. 8 schematically shows another structural diagram of a proposed transient voltage suppressor with adjustable trigger and holding voltages in accordance with one embodiment of the present invention, in which a first lightly doped implant layer is further disposed. As we can see from the FIG. 8 embodiment, the transient voltage suppressor with adjustable trigger and holding voltages 1B may further include the first lightly doped implant layer 181, which is disposed in the second well region ("P-well") 22 and the first lightly doped implant layer 181 is relatively surrounding the second heavily doped region ("N+") 32. The first lightly doped implant layer 181 is having the first conductivity type, and illustrative as an N-type Electrostatic Discharge (NESD) layer in the embodiment of FIG. 8.

Figure 9:
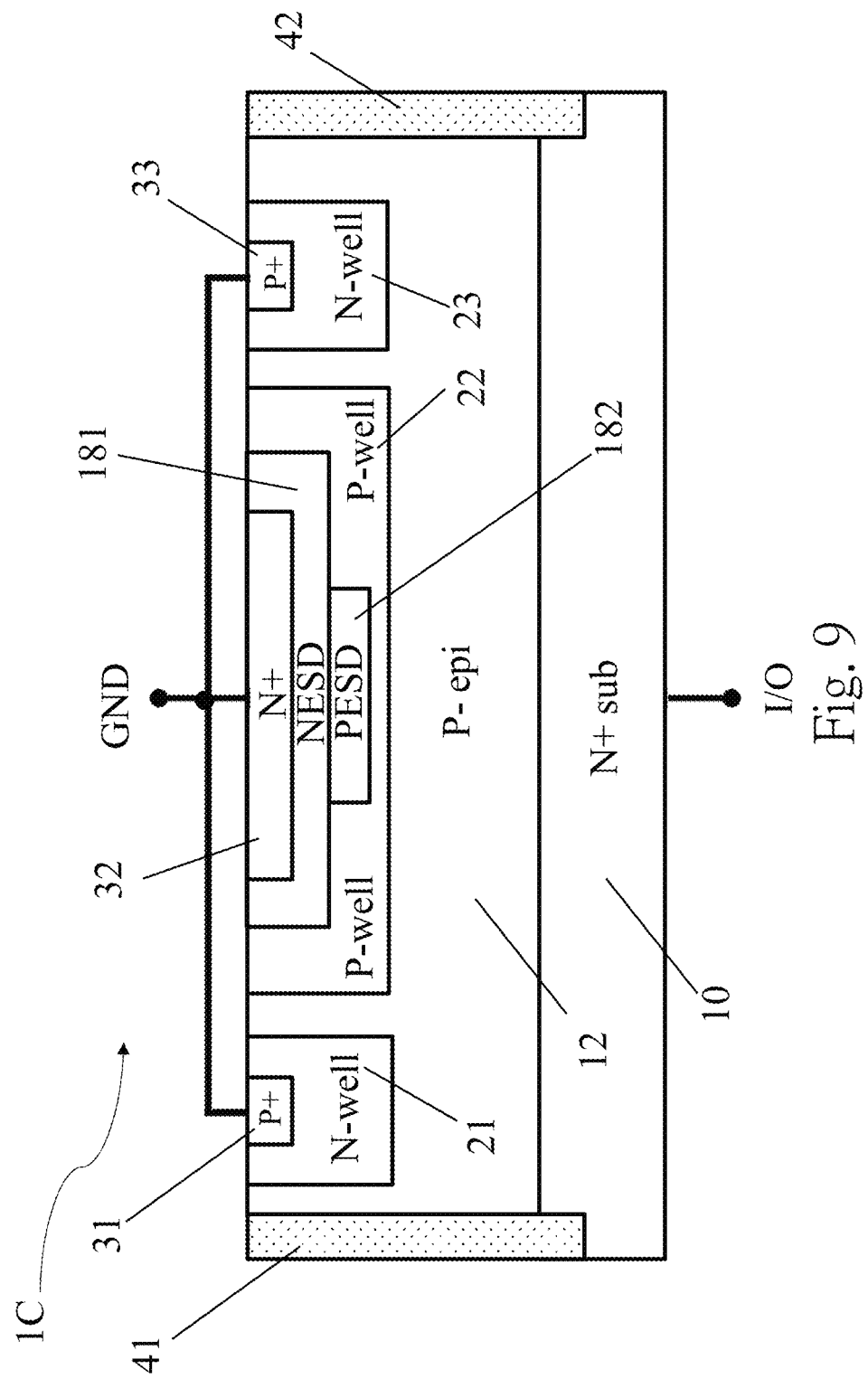
FIG. 9 schematically shows another structural diagram of a proposed transient voltage suppressor with adjustable trigger and holding voltages in accordance with the FIG. 8 embodiment of the present invention, in which a second lightly doped implant layer is further disposed.

Furthermore, FIG. 9 schematically shows another structural diagram of a proposed transient voltage suppressor with adjustable trigger and holding voltages in accordance with the FIG. 8 embodiment of the present invention, in which a second lightly doped implant layer is further disposed. As we can see from the FIG. 9 embodiment, the transient voltage suppressor with adjustable trigger and holding voltages IC may further include a second lightly doped implant layer 182. In such a variant embodiment of FIG. 9, the second lightly doped implant layer 182 has the second conductivity type, and the second lightly doped implant layer 182 of the second conductivity type can be illustrative as a P-type Electrostatic Discharge (PESD) layer 182. According to the FIG. 9 embodiment, the second lightly doped implant layer 182 is buried in the second well region ("P-well") 22 and is underneath the foregoing first lightly doped implant layer ("NESD") 181 in order to avoid corner breakdown generated at the corners in between the first lightly doped implant layer ("NESD") 181 and the second well region ("P-well") 22.

Figure 10:
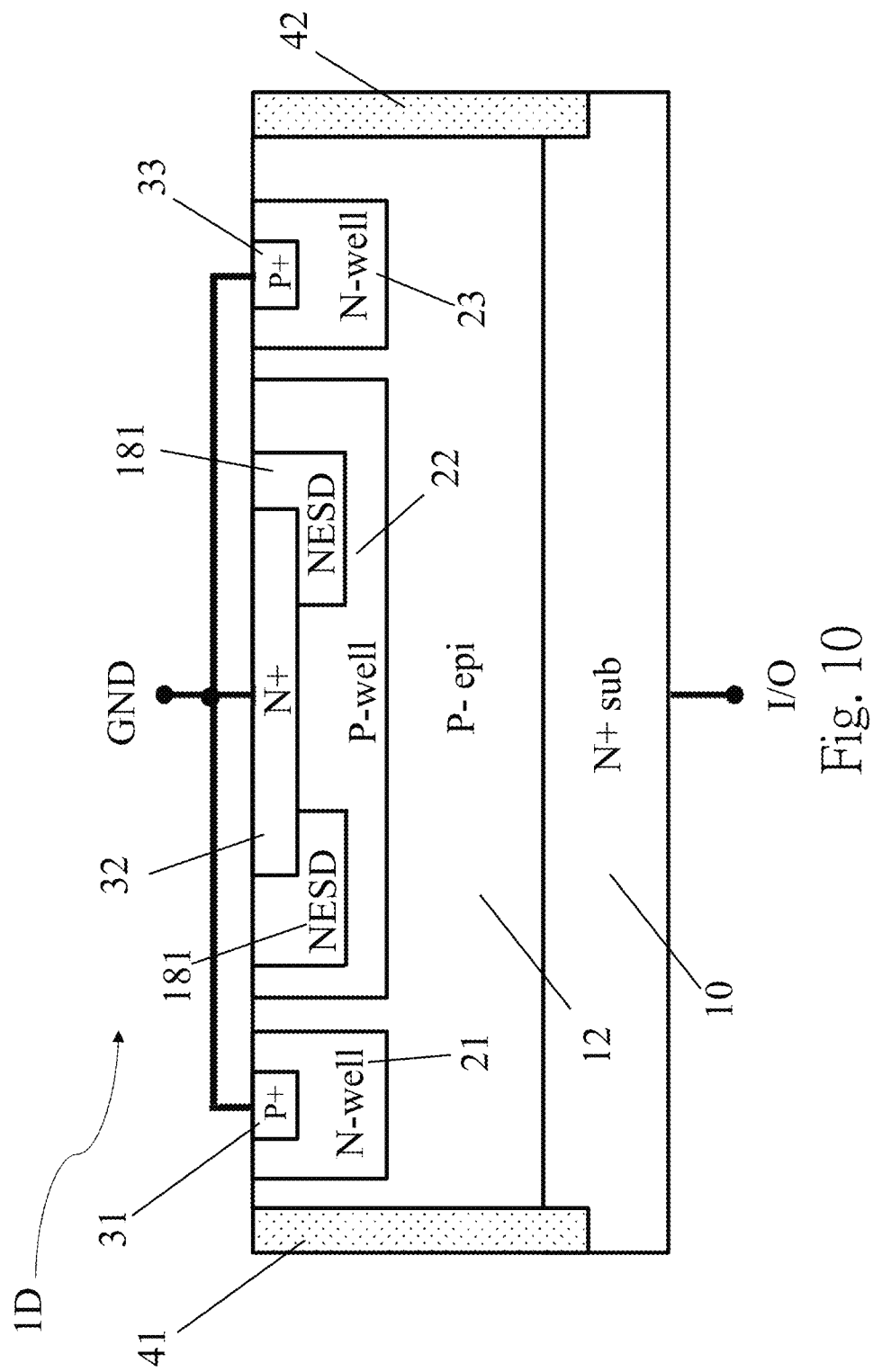
FIG. 10 schematically shows another structural diagram of a proposed transient voltage suppressor with adjustable trigger and holding voltages in accordance with one embodiment of the present invention, in which two first lightly doped implant layers are further disposed.

And moreover, the configurations of the above-mentioned first lightly doped implant layer ("NESD") and second lightly doped implant layer ("PESD") are certainly not limited by the previously described embodiments. Please refer to FIG. 10 for another variant embodiment of the present invention, in which FIG. 10 schematically shows another structural diagram of a proposed transient voltage suppressor with adjustable trigger and holding voltages in accordance with one embodiment of the present invention, in which two first lightly doped implant layers 181 may also be further disposed. As we can see from the FIG. 10 embodiment, the transient voltage suppressor with adjustable trigger and holding voltages 1D may alternatively further include two first lightly doped implant layers 181, which are disposed in the second well region ("P-well") 22 and each of the first lightly doped implant layers 181 is disposed at a corner of the second heavily doped region (N+) 32. As can be seen, both of the two first lightly doped implant layers 181 have the first conductivity type and are illustrative as an N-type Electrostatic Discharge (NESD) layer in the embodiment of FIG. 10.

Figure 11:
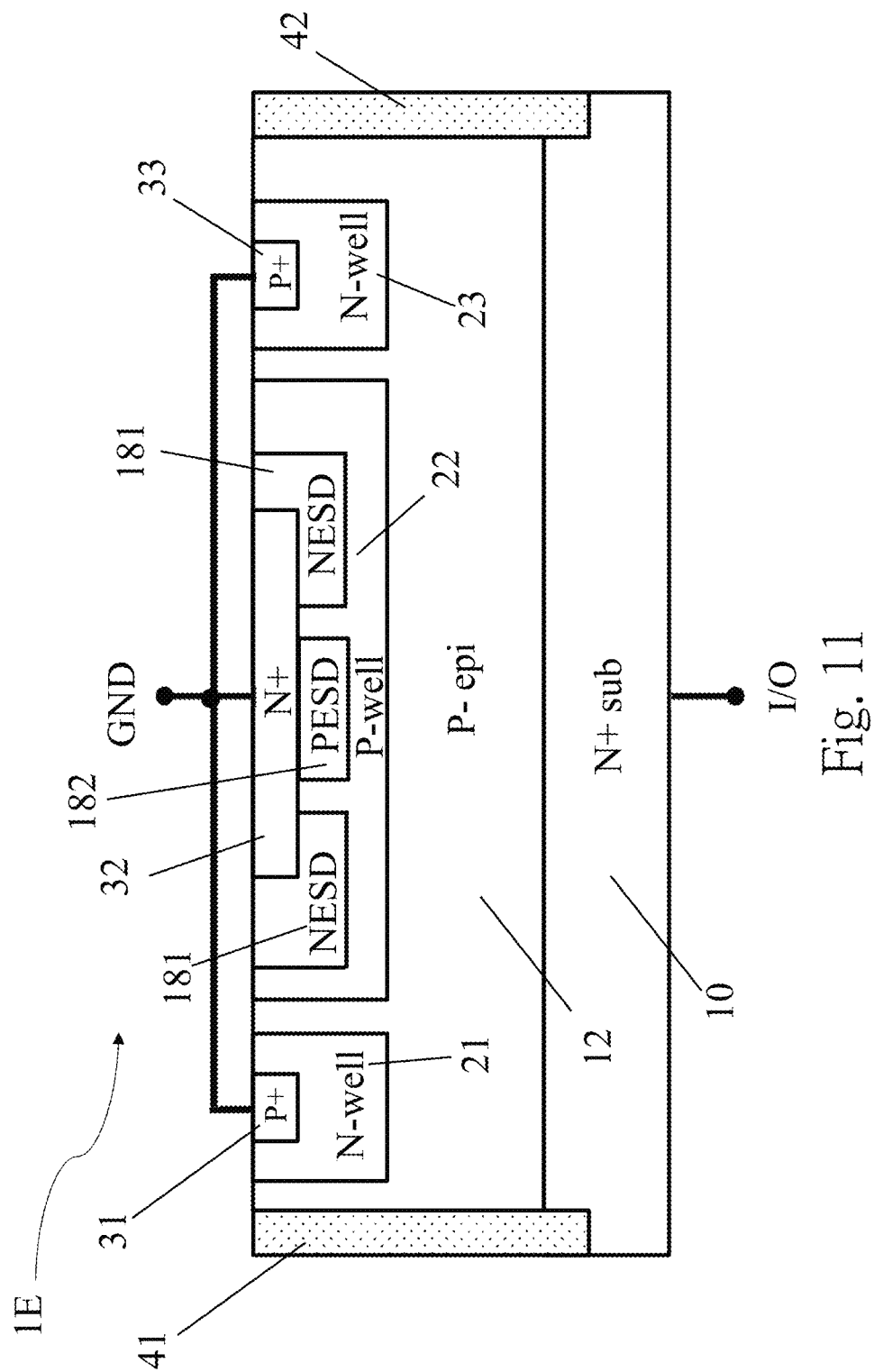
FIG. 11 schematically shows another structural diagram of a proposed transient voltage suppressor with adjustable trigger and holding voltages in accordance with the FIG. 10 embodiment of the present invention, in which a second lightly doped implant layer is further disposed.

And yet, FIG. 11 schematically shows another structural diagram of a proposed transient voltage suppressor with adjustable trigger and holding voltages in accordance with the FIG. 10 embodiment of the present invention, in which a second lightly doped implant layer is further disposed. As we can see from the FIG. 11 embodiment, the transient voltage suppressor with adjustable trigger and holding voltages 1E may further include a second lightly doped implant layer 182. In such a variant embodiment of FIG. 11, the second lightly doped implant layer 182 has the second conductivity type, and the second lightly doped implant layer 182 of the second conductivity type is illustrative as a P-type Electrostatic Discharge (PESD) layer 182. According to the FIG. 11 embodiment, the second lightly doped implant layer 182 is buried in the second well region ("P-well") 22 and the second lightly doped implant layer ("PESD") 182 is configured between the two first lightly doped implant layers ("NESD") 181. It is evident that the embodiments as proposed in FIG. 8-11 are provided and designed for the purpose of avoiding corner breakdown generated at the corners in between the first lightly doped implant layer ("NESD") 181 and the second well region ("P-well") 22. In addition, according to these variant embodiments of the present invention, it is believed that the thickness and resistivity of the lightly doped epitaxial layer ("P– epi") 12, the second well region ("P-well") 22, the first lightly doped implant layer ("NESD") 181, and the second lightly doped implant layer ("PESD") 182 are also variables which can be used so as to adjust the gain of the formed floating base bipolar junction transistor of the present invention. As a result, the proposed transient voltage suppressor of the present invention is not only beneficial in having both an adjustable trigger voltage as well as an adjustable holding voltage, but also superior in electrical performances since a better gain and a larger range of breakdown voltages can be accomplished.

Figure 12:
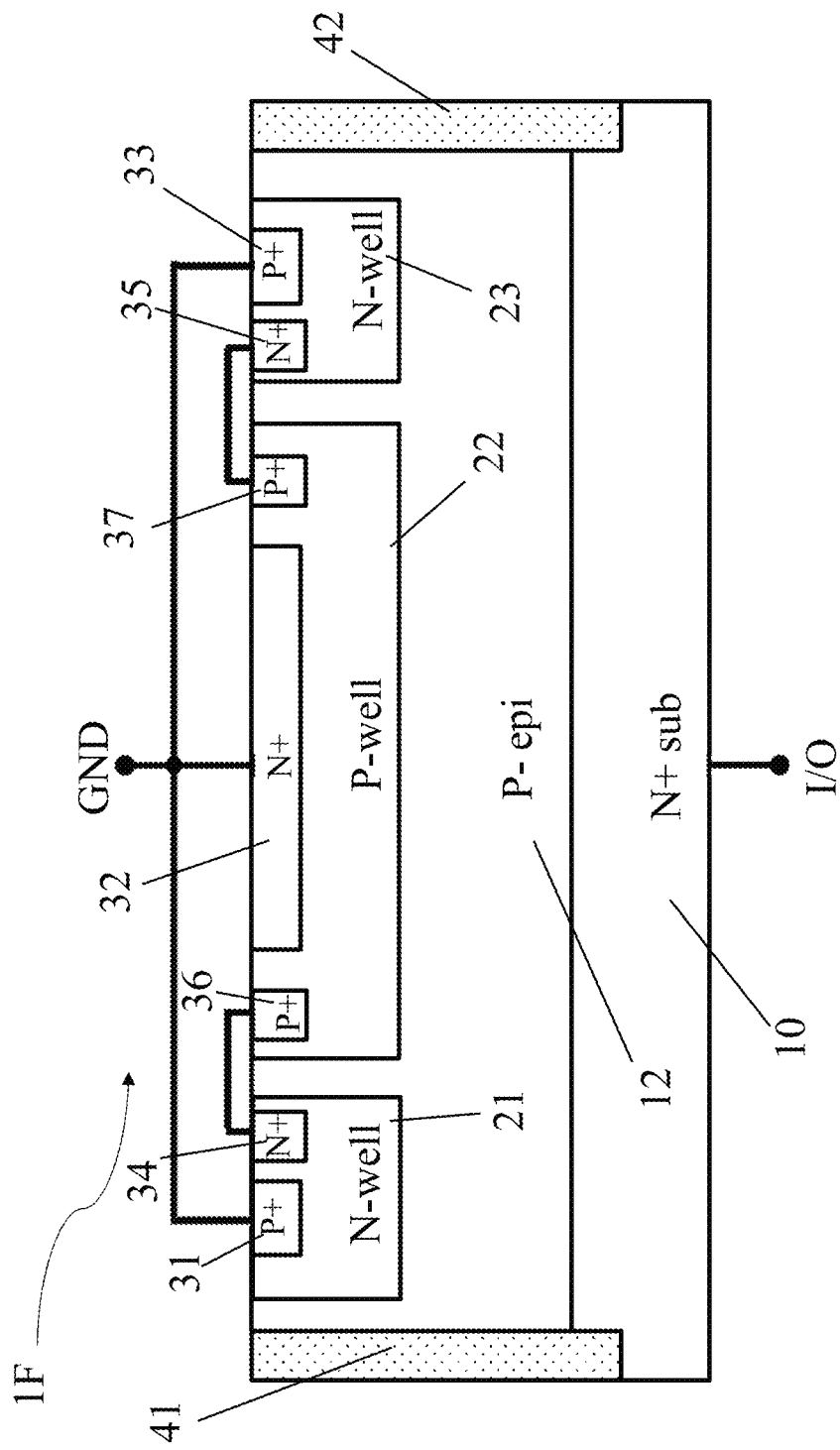
FIG. 12 schematically shows another structural diagram of a proposed transient voltage suppressor with adjustable trigger and holding voltages in accordance with one embodiment of the present invention, in which a fourth heavily doped region, a fifth heavily doped region, a sixth heavily doped region and a seventh heavily doped region are further disposed.

And furthermore, please proceed to refer to FIG. 12, which schematically shows another structural diagram of a proposed transient voltage suppressor with adjustable trigger and holding voltages in accordance with one embodiment of the present invention, in which a fourth heavily doped region 34, a fifth heavily doped region 35, a sixth heavily doped region 36 and a seventh heavily doped region 37 are further disposed. As we can see from the FIG. 12 embodiment, the transient voltage suppressor with adjustable trigger and holding voltages IF may further include the fourth heavily doped region 34, the fifth heavily doped region 35, the sixth heavily doped region 36 and the seventh heavily doped region 37, and the fourth heavily doped region 34 has the first conductivity type, the fifth heavily doped region 35 has the first conductivity type, the sixth heavily doped region 36 has the second conductivity type, and the seventh heavily doped region 37 has the second conductivity type. As a result, as can be seen in the FIG. 12 embodiment, the fourth heavily doped region 34 and the fifth heavily doped region 35 of the first conductivity type are illustrative as an N+ region, while the sixth heavily doped region 36 and the seventh heavily doped region 37 of the second conductivity type are illustrative as a P+ region. In such an embodiment, the fourth heavily doped region (N+) 34 of the first conductivity type is disposed in the first well region ("N-well") 21, and the fifth heavily doped region (N+) 35 of the first conductivity type is disposed in the third well region ("N-well") 23. On the other hand, the sixth heavily doped region (P+) 36 of the second conductivity type is disposed in the second well region ("P-well") 22, and the seventh heavily doped region ("P+") 37 of the second conductivity type is also disposed in the second well region ("P-well") 22. In addition, the fourth heavily doped region (N+) 34 of the first conductivity type and the sixth heavily doped region (P+) 36 of the second conductivity type are electrically connected in common. And the fifth heavily doped region (N+) 35 of the first conductivity type and the seventh heavily doped region ("P+") 37 of the second conductivity type are electrically connected in common. In such a variant embodiment as illustrative in the transient voltage suppressor with adjustable trigger and holding voltages 1F of FIG. 12, when it is operated under a negative-surged mode (the sweeping voltage is injected from the ground terminal GND) and the silicon controlled rectifier having a floating base is formed, it is believed that the trigger voltage ($V_T$) of the floating base of silicon controlled rectifier can be determined by two forward biased diodes and equal to (0.7V+0.7V=1.4V), instead of relying on the dopants concentration of the first and the third well regions ("N-well") 21 and 23.

Figure 13:
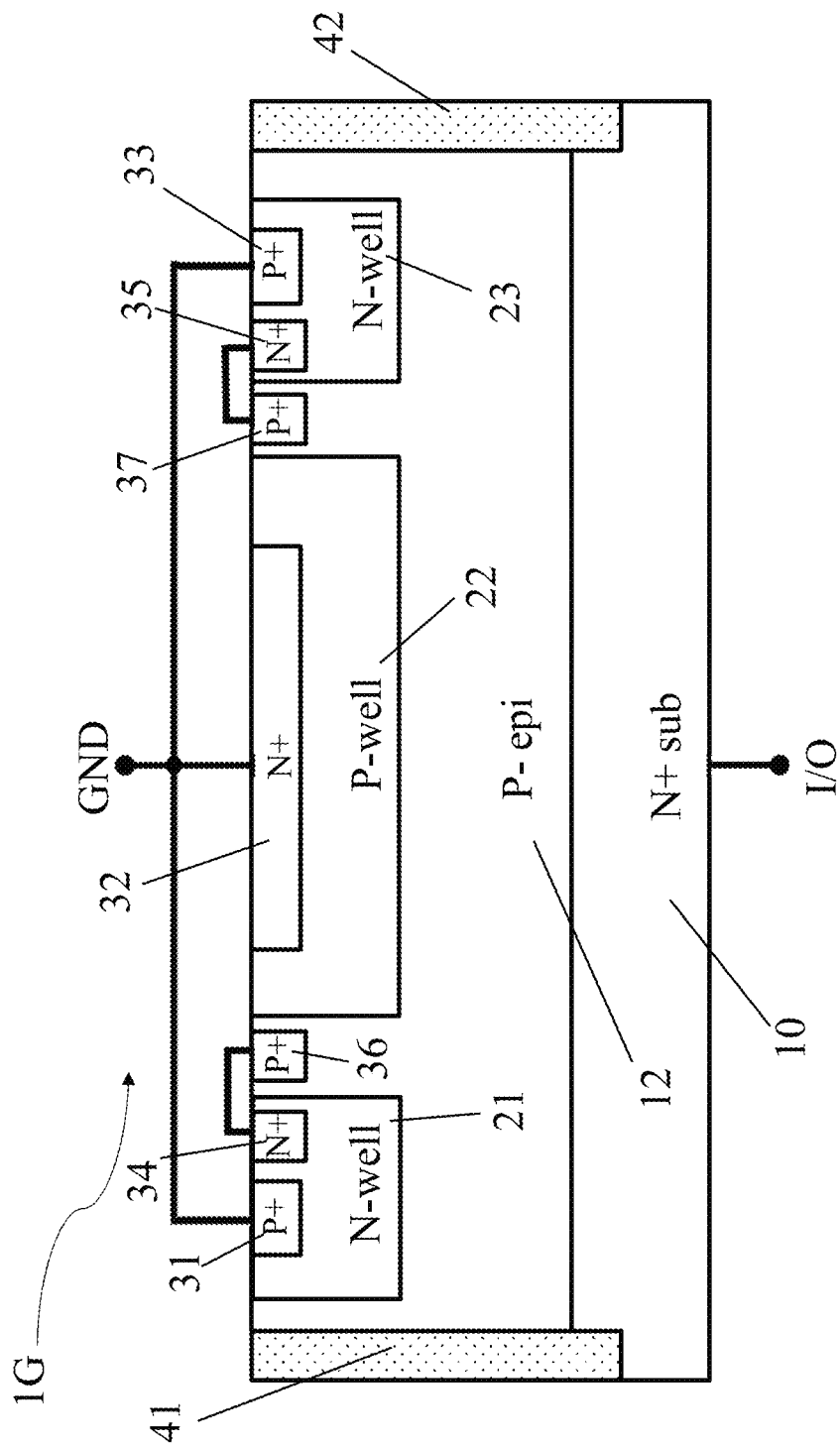
FIG. 13 schematically shows another modified structural diagram of a proposed transient voltage suppressor with adjustable trigger and holding voltages in accordance with the FIG. 12 embodiment of the present invention, in which the sixth heavily doped region and the seventh heavily doped region are configured in the lightly doped epitaxial layer.

And moreover, FIG. 13 schematically shows another modified structural diagram of a proposed transient voltage suppressor with adjustable trigger and holding voltages in accordance with the FIG. 12 embodiment of the present invention. As we can see from the FIG. 13 embodiment, the transient voltage suppressor with adjustable trigger and holding voltages 1G may also further include the fourth heavily doped region (N+) 34 of the first conductivity type which is disposed in the first well region ("N-well") 21, the fifth heavily doped region (N+) 35 of the first conductivity type which is disposed in the third well region ("N-well") 23, the sixth heavily doped region (P+) 36 of the second conductivity type and the seventh heavily doped region (P+) 37 of the second conductivity type. The fourth heavily doped region (N+) 34 of the first conductivity type and the sixth heavily doped region (P+) 36 of the second conductivity type are electrically connected in common. And the fifth heavily doped region (N+) 35 of the first conductivity type and the seventh heavily doped region ("P+") 37 of the second conductivity type are electrically connected in common. However, it draws our attention that, what differs from the previously described embodiment in FIG. 12 is that, in the embodiment of FIG. 13, the sixth heavily doped region (P+) 36 of the second conductivity type and the seventh heavily doped region (P+) 37 of the second conductivity type can be configured in the lightly doped epitaxial layer ("P– epi") 12 instead of in the second well region ("P-well") 22 as described earlier in the FIG. 12 embodiment. And the trigger voltage ($V_T$) of the silicon controlled rectifier having a floating base under the negative-surged mode can be also determined by two forward biased diodes and equal to (0.7V+0.7V=1.4V), without being affected by the dopants concentration of the first and the third well regions ("N-well") 21 and 23. The inventive effects of the present invention may also be made according to such a modified embodiment.

Figure 14:
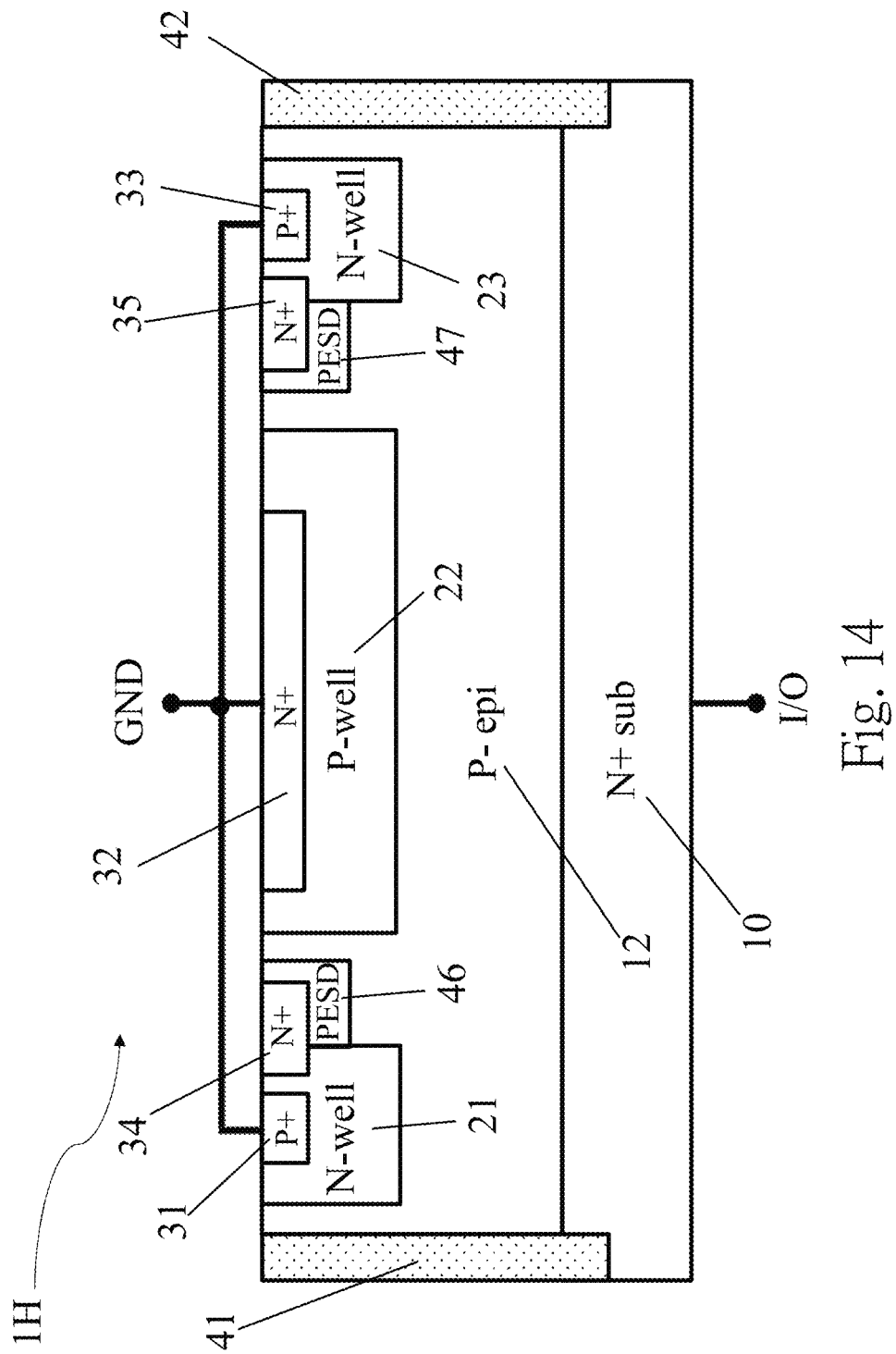
FIG. 14 schematically shows another structural diagram of a proposed transient voltage suppressor with adjustable trigger and holding voltages in accordance with one embodiment of the present invention, in which a fourth heavily doped region, a fifth heavily doped region, a sixth lightly doped implant layer and a seventh lightly doped implant layer are further disposed.
Figure 15:
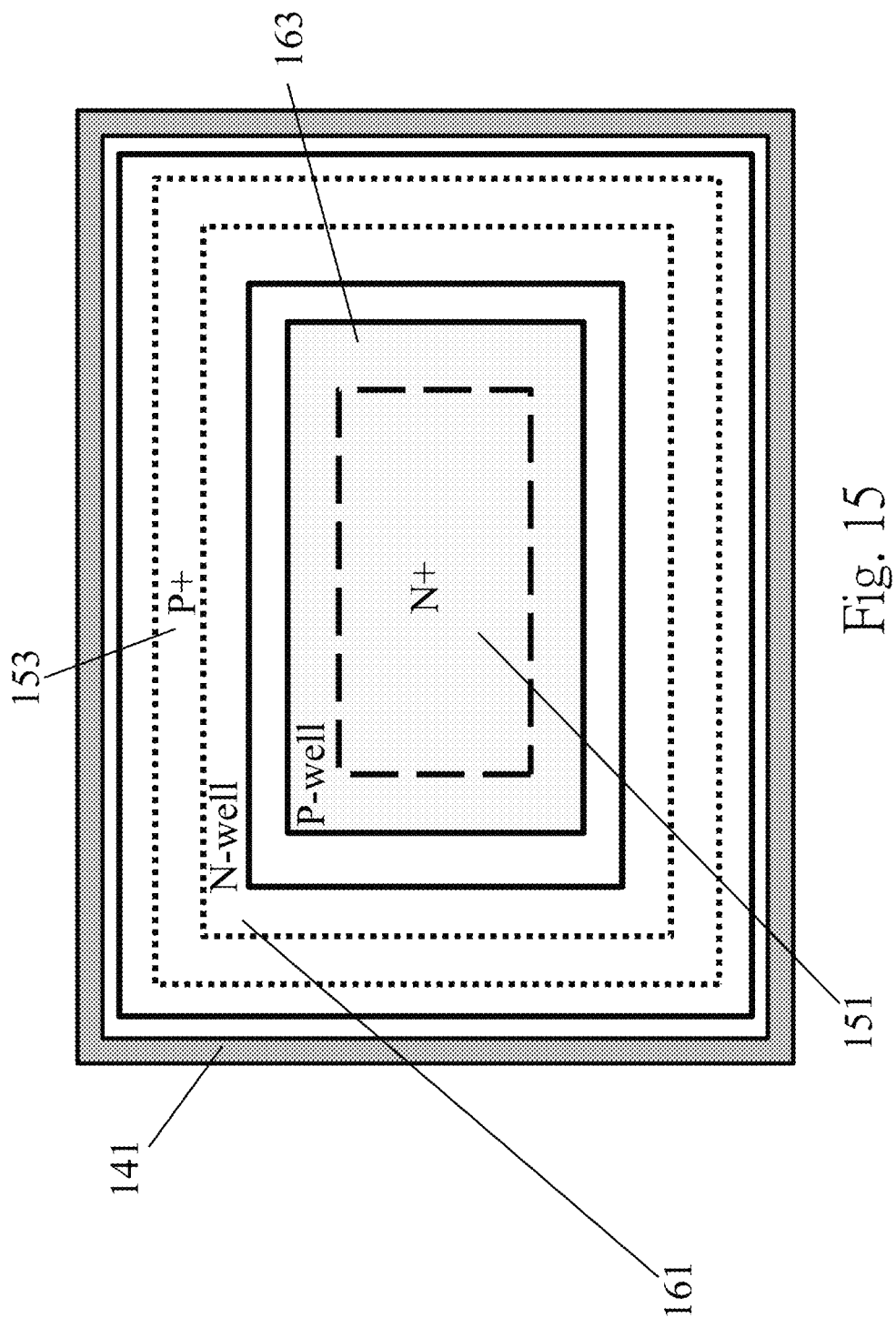
FIG. 15 schematically shows a circuit layout configuration for implementing the proposed transient voltage suppressor of the present invention.
Figure 16:
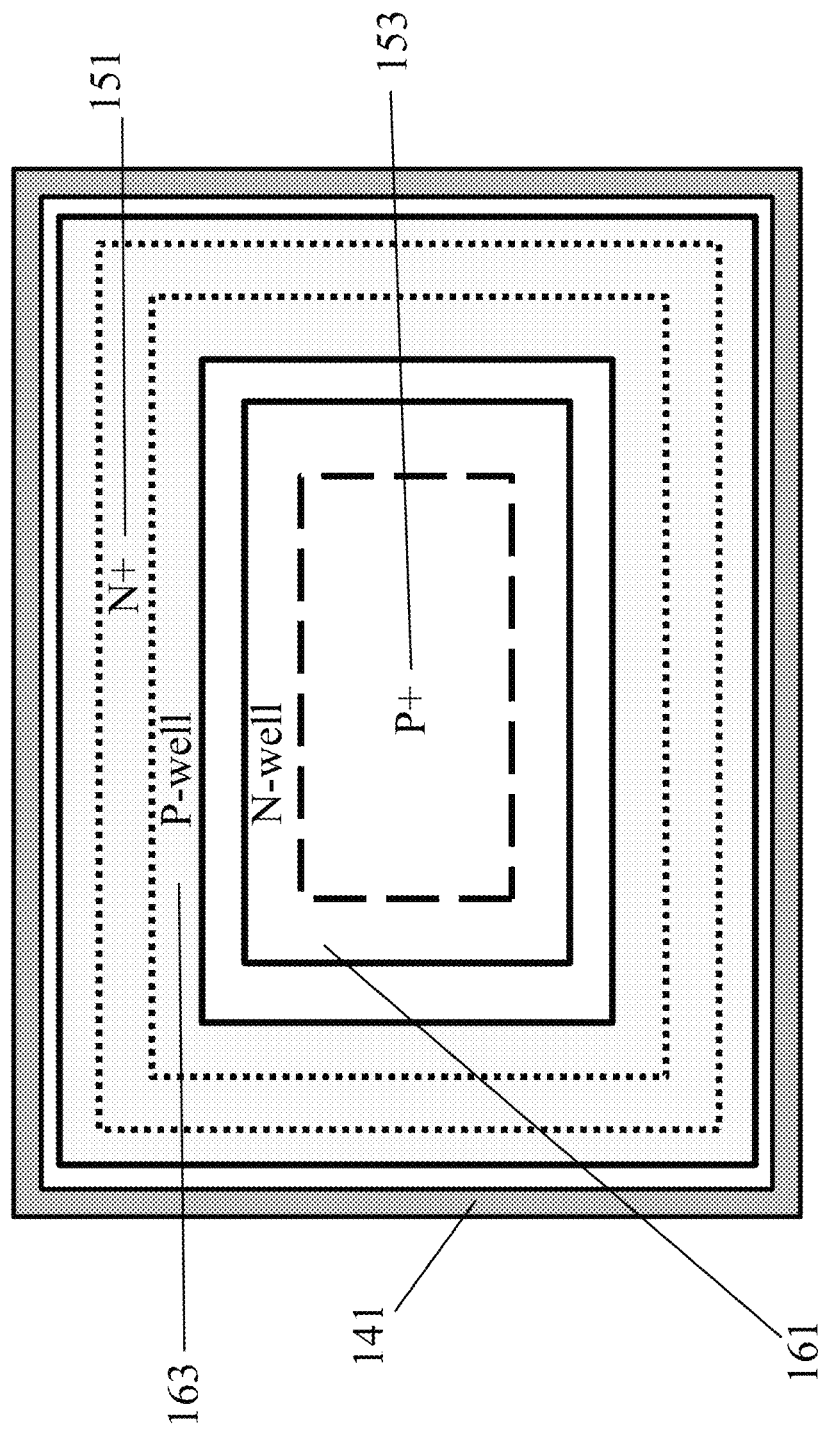
FIG. 16 schematically shows another circuit layout configuration for implementing the proposed transient voltage suppressor of the present invention.
Figure 17:
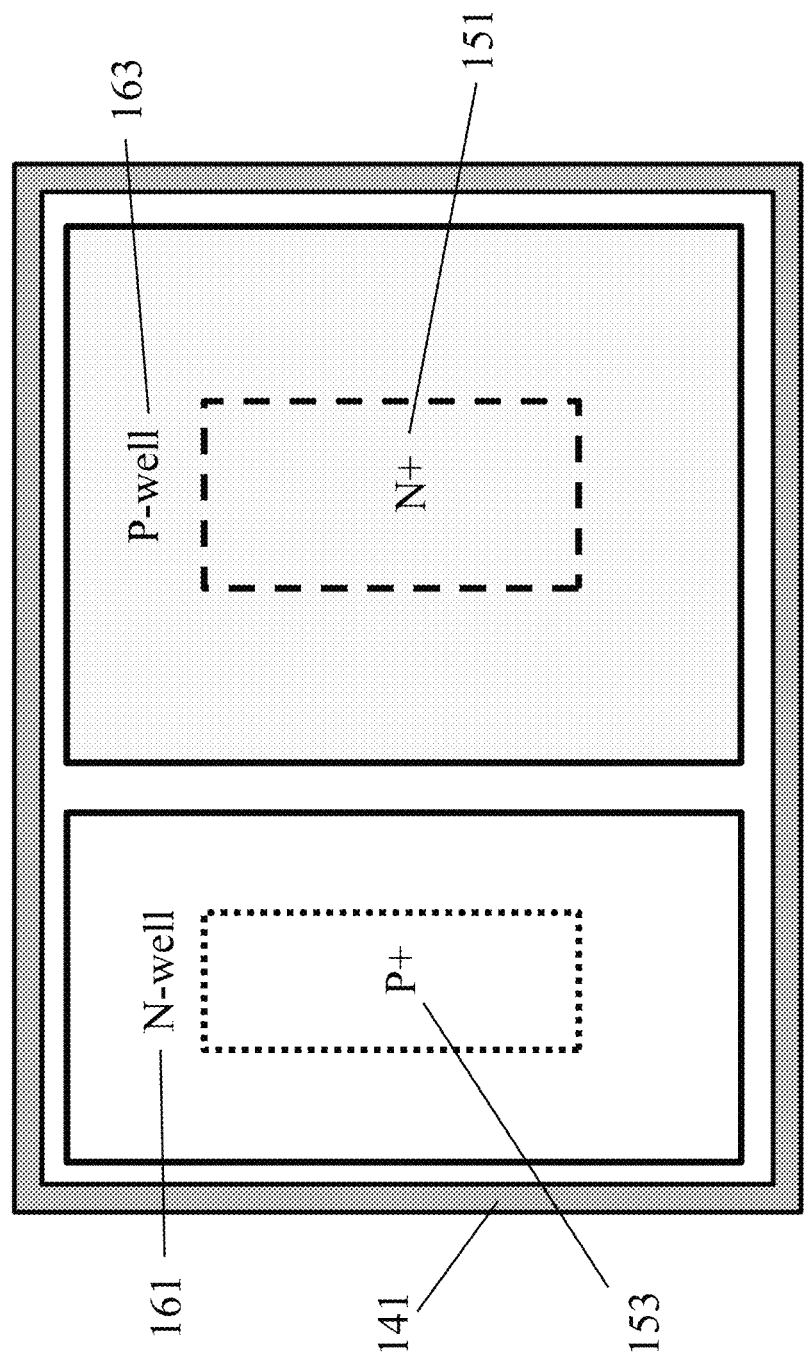
FIG. 17 schematically shows one another circuit layout configuration for implementing the proposed transient voltage suppressor of the present invention.
Figure 18:
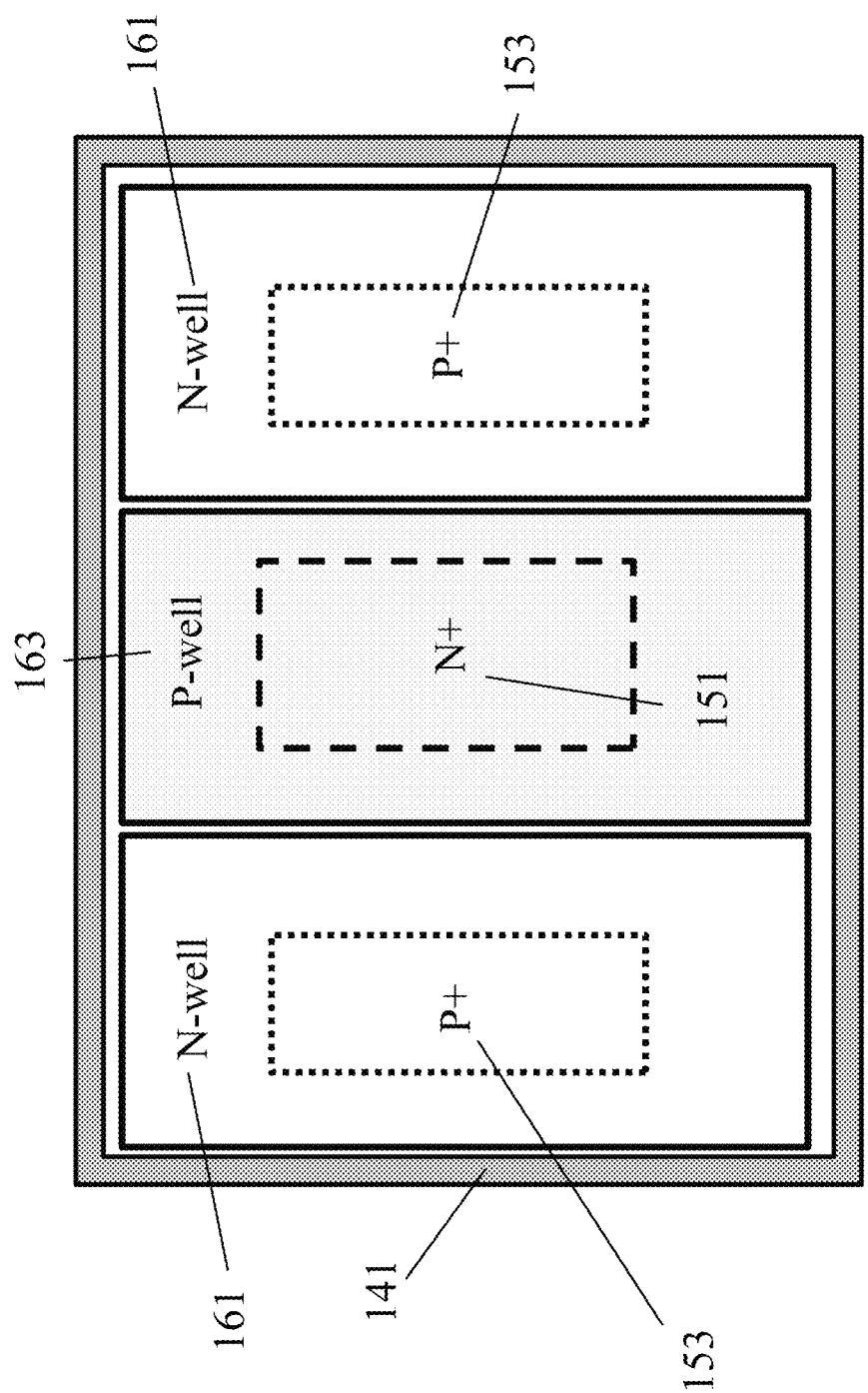
FIG. 18 schematically shows one yet another circuit layout configuration for implementing the proposed transient voltage suppressor of the present invention.

And still in another aspect, please subsequently refer to FIG. 14 for another modified structural diagram of a proposed transient voltage suppressor with adjustable trigger and holding voltages in accordance with one more embodiment of the present invention. In the FIG. 14 embodiment, the transient voltage suppressor with adjustable trigger and holding voltages 1H may also further include the fourth heavily doped region (N+) 34 of the first conductivity type, the fifth heavily doped region (N+) 35 of the first conductivity type, a sixth lightly doped implant layer (PESD) 46 of the second conductivity type, and a seventh lightly doped implant layer (PESD) 47 of the second conductivity type. As can be seen from the FIG. 14 embodiment, the fourth heavily doped region (N+) 34 of the first conductivity type is disposed between the first heavily doped region (P+) 31 and the second heavily doped region (N+) 32, the sixth lightly doped implant layer (PESD) 46 of the second conductivity type is disposed in the lightly doped epitaxial layer ("P– epi") 12, and the fourth heavily doped region (N+) 34 is surrounded by the sixth lightly doped implant layer (PESD) 46 and the first well region ("N-well") 21. In addition, the fifth heavily doped region (N+) 35 of the first conductivity type is disposed between the third heavily doped region (P+) 33 and the second heavily doped region (N+) 32, the seventh lightly doped implant layer (PESD) 47 of the second conductivity type is disposed in the lightly doped epitaxial layer ("P– epi") 12, and the fifth heavily doped region (N+) 35 is surrounded by the seventh lightly doped implant layer (PESD) 47 and the third well region ("N-well") 23. In such an embodiment as further provided in FIG. 14, it is also apparent that when a negative-surged mode is performed and applied to the transient voltage suppressor 1H, the silicon controlled rectifier having a floating base is thus formed, and the trigger voltage ($V_T$) of the silicon controlled rectifier having a floating base under the negative-surged mode can be determined by the junction of the fourth heavily doped region (N+) 34 and the sixth lightly doped implant layer (PESD) 46, and the junction of the fifth heavily doped region (N+) 35 and the seventh lightly doped implant layer (PESD) 47, without depending on and/or being affected by the dopants concentration of the first and the third well regions ("N-well") 21 and 23. The inventive effects of the present invention are believed to be also accomplished according to such a modified embodiment.

In the following sections, the Applicants of the present invention further provide a plurality of circuit layout configurations according to the embodiment as shown in the previously proposed FIG. 4. Please refer to FIG. 15, FIG. 16, FIG. 17, and FIG. 18 for the detailed configurations. As we can see, these circuit layout configurations, including the N+ region 151, the P+ region 153, the N-well region 161, the P-well region 163 and the trench 141 are applicable and practicable for implementing the proposed transient voltage suppressor of the present invention. And thus, it is apparent that, compared to the conventional techniques, the present invention is characterized by having extraordinary layout flexibility and can be composed of a variety of layout designs. Accordingly, in view of the technical contents and manners disclosed in the present invention without departing from the spirits of the present invention, it is believed that those skilled in the art and having general knowledge are able to make appropriate modifications or variations based on necessary circuit layout requirements, and the present invention is not restricted by the certain limited configurations and/or circuit diagrams disclosed in the embodiments of the present invention. As a result, either the modifications or the variations should still fall into the scope of the present invention, and the present invention covers the modifications and its equality.

To sum up, according to the technical characteristics of the present invention which have been provided by the Applicants as illustrated in the previous paragraphs, it is obvious that the disclosed transient voltage suppressor with adjustable trigger and holding voltages is effective. As can be seen from the embodiments, the present invention is aimed to propose providing an N-well region for surrounding a P+ heavily doped region such that the lightly doped epitaxial layer (P– epi) is isolated. Therefore, under a positive-surged mode (the sweeping voltage is injected from the I/O pin from the N-type heavily doped substrate), it is believed that a bipolar junction transistor having a floating base is formed. On the other hand, while under a negative-surged mode (the sweeping voltage is injected from the ground terminal), then a silicon controlled rectifier having a floating base is formed, and the floating base silicon controlled rectifier has a diode-like electrical performance.

Meanwhile, since a common discharging path in the positive-surged mode and in the negative-surged mode can be used according to the present invention, the conduction area under the positive-surged mode can be increased, and the layout area under the negative-surged mode can be less-consuming. A great number of merits and advantages can be accomplished by adopting the present invention. Therefore, in view of all, it is obvious that the present invention is not only novel and inventive but also believed to be advantageous of solving and avoiding the conventional issues existing in the prior arts.

As a result, when compared to the prior arts, it is ensured that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A transient voltage suppressor with adjustable trigger and holding voltages, comprising:
   a heavily doped substrate of a first conductivity type, which is electrically connected to a first node;
   a lightly doped epitaxial layer of a second conductivity type, which is formed on the heavily doped substrate;
   a first well region of the first conductivity type, a second well region of the second conductivity type and a third well region of the first conductivity type, which are configured and formed in the lightly doped epitaxial layer, wherein a first heavily doped region of the second conductivity type is further disposed in the first well region, a second heavily doped region of the first conductivity type is further disposed in the second well region, and a third heavily doped region of the second conductivity type is further disposed in the third well region, and wherein the first heavily doped region, the second heavily doped region and the third heavily doped region are commonly electrically connected to a second node; and
   two trenches, being disposed opposite in the heavily doped substrate, having a depth not less than that of the lightly doped epitaxial layer, wherein each of the two trenches is respectively configured at an outer side of the first well region and the third well region for electrical isolation, and wherein the first conductivity type is N type, the second conductivity type is P type, and the first node and the second node are electrically coupled to an I/O pin and a ground terminal, respectively, and wherein when a sweeping voltage is injected into the ground terminal, a silicon controlled rectifier having a floating base is formed and is composed of the first heavily doped region, the third heavily doped region, the first well region, the third well region, the lightly doped epitaxial layer and the heavily doped substrate, and the silicon controlled rectifier having the floating base acts as a forward biased diode and shows no snapback effect.

2. The transient voltage suppressor with adjustable trigger and holding voltages according to claim 1, wherein when the sweeping voltage is injected into the I/O pin, a bipolar junction transistor having a floating base is formed and is composed of the heavily doped substrate, the lightly doped epitaxial layer, the second well region and the second heavily doped region.

3. The transient voltage suppressor with adjustable trigger and holding voltages according to claim 2, wherein the floating base of the bipolar junction transistor is formed by the lightly doped epitaxial layer and the second well region.

4. The transient voltage suppressor with adjustable trigger and holding voltages according to claim 1, wherein the floating base of the silicon controlled rectifier is formed by the first well region, the third well region, and the lightly doped epitaxial layer.

5. The transient voltage suppressor with adjustable trigger and holding voltages according to claim 1, further comprising a blanket implant layer, which is disposed between the lightly doped epitaxial layer and the heavily doped substrate.

6. The transient voltage suppressor with adjustable trigger and holding voltages according to claim 5, wherein the blanket implant layer is of the first conductivity type or of the second conductivity type.

7. The transient voltage suppressor with adjustable trigger and holding voltages according to claim 5, wherein the depth of each of the two trenches is not less than that of the blanket implant layer.

8. The transient voltage suppressor with adjustable trigger and holding voltages according to claim 1, further comprising a first lightly doped implant layer of the first conductivity type, wherein the first lightly doped implant layer of the first conductivity type is disposed in the second well region and surrounding the second heavily doped region.

9. The transient voltage suppressor with adjustable trigger and holding voltages according to claim 8, further comprising a second lightly doped implant layer of the second conductivity type, wherein the second lightly doped implant layer of the second conductivity type is buried in the second well region and underneath the first lightly doped implant layer.

10. The transient voltage suppressor with adjustable trigger and holding voltages according to claim 1, further comprising two first lightly doped implant layers of the first conductivity type, wherein the two first lightly doped implant layers of the first conductivity type are disposed in the second well region and each of the two first lightly doped implant layers is disposed at a corner of the second heavily doped region.

11. The transient voltage suppressor with adjustable trigger and holding voltages according to claim 10, further comprising a second lightly doped implant layer of the second conductivity type, wherein the second lightly doped implant layer of the second conductivity type is buried in the second well region and between the two first lightly doped implant layers.

12. The transient voltage suppressor with adjustable trigger and holding voltages according to claim 1, further comprising a fourth heavily doped region of the first conductivity type being disposed in the first well region, a fifth heavily doped region of the first conductivity type being disposed in the third well region, a sixth heavily doped region of the second conductivity type being disposed in the second well region, and a seventh heavily doped region of the second conductivity type being disposed in the second well region, wherein the fourth heavily doped region of the first conductivity type and the sixth heavily doped region of the second conductivity type are electrically connected in common, and the fifth heavily doped region of the first conductivity type and the seventh heavily doped region of the second conductivity type are electrically connected in common.

13. The transient voltage suppressor with adjustable trigger and holding voltages according to claim 1, further comprising a fourth heavily doped region of the first conductivity type being disposed in the first well region, a fifth heavily doped region of the first conductivity type being disposed in the third well region, a sixth heavily doped region of the second conductivity type being disposed in the lightly doped epitaxial layer, and a seventh heavily doped region of the second conductivity type being disposed in the lightly doped epitaxial layer, wherein the fourth heavily doped region of the first conductivity type and the sixth heavily doped region of the second conductivity type are electrically connected in common, and the fifth heavily doped region of the first conductivity type and the seventh heavily doped region of the second conductivity type are electrically connected in common.

14. The transient voltage suppressor with adjustable trigger and holding voltages according to claim 1, further comprising a fourth heavily doped region of the first conductivity type, a fifth heavily doped region of the first conductivity type, a first lightly doped implant layer of the second conductivity type, and a second lightly doped implant layer of the second conductivity type, wherein the fourth heavily doped region is disposed between the first heavily doped region and the second heavily doped region, the first lightly doped implant layer is disposed in the lightly doped epitaxial layer, and the fourth heavily doped region is surrounded by the first lightly doped implant layer and the first well region, and wherein the fifth heavily doped region is disposed between the third heavily doped region and the second heavily doped region, the second lightly doped implant layer is disposed in the lightly doped epitaxial layer, and the fifth heavily doped region is surrounded by the second lightly doped implant layer and the third well region.

* * * * *